United States Patent
Chang et al.

(10) Patent No.: US 9,253,890 B2
(45) Date of Patent: Feb. 2, 2016

(54) PATTERNED CONDUCTIVE FILM, METHOD OF FABRICATING THE SAME, AND APPLICATION THEREOF

(71) Applicant: Industrial Technology Research Institute, Hsinchu (TW)

(72) Inventors: Yu-Pei Chang, Tainan (TW); Ming-Huan Yang, Taichung (TW); Chun-Yi Chiu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 168 days.

(21) Appl. No.: 14/080,810

(22) Filed: Nov. 15, 2013

(65) Prior Publication Data

US 2015/0047885 A1 Feb. 19, 2015

(30) Foreign Application Priority Data

Aug. 16, 2013 (TW) .............................. 102129549 A

(51) Int. Cl.
| | |
|---|---|
| *B32B 3/02* | (2006.01) |
| *H05K 3/02* | (2006.01) |
| *G06F 3/044* | (2006.01) |
| *H05K 3/20* | (2006.01) |
| *H05K 1/09* | (2006.01) |
| *B82Y 40/00* | (2011.01) |
| *H05K 3/46* | (2006.01) |

(52) U.S. Cl.
CPC *H05K 3/02* (2013.01); *G06F 3/044* (2013.01); *H05K 3/20* (2013.01); *B82Y 40/00* (2013.01); *G06F 2203/04103* (2013.01); *G06F 2203/04112* (2013.01); *H05K 1/097* (2013.01); *H05K 3/4685* (2013.01); *H05K 2201/0108* (2013.01); *H05K 2201/026* (2013.01); *H05K 2201/0257* (2013.01); *H05K 2201/09245* (2013.01); *H05K 2203/1105* (2013.01); *H05K 2203/1142* (2013.01); *Y10S 977/932* (2013.01); *Y10T 428/24802* (2015.01)

(58) Field of Classification Search
CPC .............. Y10T 428/24802; Y10T 428/24893; H05K 2201/026; H01L 29/0669; H01L 29/413
See application file for complete search history.

(56) References Cited

U.S. PATENT DOCUMENTS

| | | |
|---|---|---|
| 4,948,231 A | 8/1990 | Aoki et al. |
| 7,335,395 B2 | 2/2008 | Ward et al. |

(Continued)

FOREIGN PATENT DOCUMENTS

| | | |
|---|---|---|
| CN | 102007571 | 4/2011 |
| JP | 2010287540 A | * 12/2010 |

(Continued)

OTHER PUBLICATIONS

Erik C. Garnett et al., "Self-limited plasmonic welding of silver nanowire junctions," Nature Materials, Mar. 2012, (Published Online: Feb. 5, 2012), pp. 241-249.

Terry Pothoven, "Laser Patterning of Silver Nanowire," Information Display Magazine, vol. 28, No. 9, Sep. 2012, where Relevant pages are from pp. 20-24.

(Continued)

*Primary Examiner* — Elizabeth Mulvaney
(74) *Attorney, Agent, or Firm* — Jianq Chyun IP Office

(57) ABSTRACT

Provided is a patterned conductive film may include a conductive interconnected nano-structure film. The conductive interconnected nano-structure film may include a first region and a second region adjacent to the first region. A conductivity of the first region may be at least 1000 times a conductivity of the second region.

26 Claims, 20 Drawing Sheets

(56) References Cited

U.S. PATENT DOCUMENTS

| | | | |
|---|---|---|---|
| 8,094,247 | B2 | 1/2012 | Allemand et al. |
| 8,178,028 | B2 | 5/2012 | Gandhi |
| 8,222,066 | B2 | 7/2012 | Tu et al. |
| 8,309,857 | B2 | 11/2012 | Goto et al. |
| 8,390,589 | B2 | 3/2013 | Hu et al. |
| 2005/0196707 | A1* | 9/2005 | Cok .................. 430/318 |
| 2011/0192633 | A1* | 8/2011 | Allemand .................. 174/128.1 |
| 2011/0253668 | A1 | 10/2011 | Winoto et al. |
| 2011/0272176 | A1* | 11/2011 | Goto et al. .................. 174/250 |
| 2011/0291058 | A1 | 12/2011 | Kunishi et al. |
| 2012/0097059 | A1 | 4/2012 | Allemand et al. |
| 2012/0308771 | A1 | 12/2012 | Drazaic et al. |

FOREIGN PATENT DOCUMENTS

| | | |
|---|---|---|
| TW | 201213956 | 4/2012 |
| TW | I372418 | 9/2012 |
| TW | 201314523 | 4/2013 |
| WO | 2012176905 | 12/2012 |
| WO | 2013094477 | 6/2013 |

OTHER PUBLICATIONS

M.E. Toimil Molares et al., "Experimental evidence on the Rayleigh instability of copper nanowires", GSI Scientific Report 2003, May 2004, p. 150.

Anuj R. Madaria et al., "Uniform, Highly Conductive, and Patterned Transparent Films of a Percolating Silver Nanowire Network on Rigid and Flexible Substrates Using a Dry Transfer Technique," Nano Research, Jun. 5, 2010, pp. 564-573.

Anuj R. Madaria et al., "Large scale, highly conductive and patterned transparent films of silver nanowires on arbitrary substrates and their application in touch screens," IOP Science Nanotechnology, Apr. 20, 2011, pp. 1-8.

Hui Wu et al., "Electrospun Metal Nanofiber Webs as High-Performance Transparent Electrode," Nano Letters, Aug. 25, 2010, pp. 4242-4248.

M. E. Toimil Molares et al., "Fragmentation of nanowires driven by Rayleigh instability," Applied Physics Letters, vol. 85, No. 22, Nov. 29, 2004, pp. 1-4.

"Office Action of Taiwan Counterpart Application", issued on May 25, 2015, p. 1-p. 6.

* cited by examiner

PATTERNED CONDUCTIVE FILM, METHOD OF FABRICATING THE SAME, AND APPLICATION THEREOF

CROSS-REFERENCE TO RELATED APPLICATION

This application claims the priority benefit of Taiwan application serial no. 102129549, filed on Aug. 16, 2013. The entirety of the above-mentioned patent application is hereby incorporated by reference herein and made a part of this specification.

BACKGROUND

1. Technical Field

The disclosure relates to a patterned conductive film, a method of fabricating the same, and application thereof.

2. Description of Related Art

A transparent conductive film can be applied in a wide range of fields, including a touch control monitor, a flexible display, a LCD panel, an OLED illumination, a solar cell and so on, in which a touch panel has the large market among them.

Scope of the market of the transparent conductive film expends as the demand of touch control products including smart phones and tablet computers constantly grows, a nano silver conductive material can become one of major materials used in the next-generation transparent conductive film for it has advantages in low costs, preferable conductivity, and flexibility.

Method for patterning a silver nanowire film can be done by using a common photolithography process to perform patterning of a nano-structure film. Nevertheless, said method can leave visible etching marks which influence an optical quality thereof. Costs are relatively higher since the common photolithography process for patterning of the nano-structure film requires use of chemicals such as etchants. When the common photolithography process is used for patterning of a nano-structure film, the silver nanowire needs to be partially washed off after an etching process may cause an environmental pollution.

SUMMARY

The embodiments of the disclosure propose a patterned conductive film, and the patterned conductive film includes a conductive interconnected nano-structure film and a patterned regulating layer. The conductive interconnected nano-structure film includes a first region and a second region adjacent to the first region. The first region has an interconnected nano-structure network and the second region has a partially discontinuous interconnected nano-structure, and a conductivity of the first region is at least 1000 times a conductivity of the second region. The patterned regulating layer is disposed at one of the first region and the second region.

The embodiments of the disclosure propose a fabricating method of a patterned conductive film, in which a conductive interconnected nano-structure film is provided, and the conductive interconnected nano-structure film includes a first region and a second region adjacent to the first region. A patterned regulating layer is disposed at the first region or the second region of the conductive interconnected nano-structure film. An energy source is provided to perform a conductivity regulating treatment to the conductive interconnected nano-structure film and the patterned regulating layer, so that the first region has an interconnected nano-structure network and the second region has a partially discontinuous interconnected nano-structure, in which a conductivity of the conductive interconnected nano-structure film of the first region is at least 1000 times a conductivity of the conductive interconnected nano-structure film of the second region.

The embodiments of the disclosure propose a touch panel, which includes a substrate, a first conductive interconnected nano-structure film, a second conductive interconnected nano-structure film and a planar layer. The first conductive interconnected nano-structure film includes a first region and a second region adjacent to the first region. The first region has an interconnected nano-structure network served as a first direction electrode pattern and the second region has a partially discontinuous interconnected nano-structure, and a conductivity of the first region is at least 1000 times a conductivity of the second region. The second conductive interconnected nano-structure film includes a third region and a fourth region adjacent to the third region. The third region has an interconnected nano-structure network served as a second direction electrode pattern, the fourth region has a partially discontinuous interconnected nano-structure, and a conductivity of the third region is at least 1000 times a conductivity of the fourth region. The planar layer is located between the first conductive interconnected nano-structure film and the second conductive interconnected nano-structure film.

The embodiments of the disclosure propose a touch panel, which includes a substrate, a first direction bridge electrode pattern, a patterned insulating layer and a conductive interconnected nano-structure film. The first direction bridge electrode pattern is located on the substrate. The patterned insulating layer covers the first direction bridge electrode pattern and exposes two ends of the first direction bridge electrode pattern. The conductive interconnected nano-structure film is located on the substrate and includes a first region, a second region and a third region. The first region and the third region are spaced apart from each other, and the second region is adjacent to the first region and the third region respectively. The first region has an interconnected nano-structure network insulated from the first direction bridge electrode pattern by using the patterned insulating layer, and served as a second direction electrode pattern. The third region has an interconnected nano-structure network served as a first direction electrode pattern, which includes a first portion and a second portion respectively located at two sides of the first region, and the first portion and the second portion are electrically connected to two ends of the first direction bridge electrode pattern not being covered by the patterned insulating layer, respectively. The second region has a partially discontinuous interconnected nano-structure, and conductivities of the first region and the third region are at least 1000 times a conductivity of the second region.

To make the above features and advantages of the present disclosure more comprehensible, several embodiments accompanied with drawings are described in detail as follows.

DETAILED DESCRIPTION

DESCRIPTION OF THE EMBODIMENTS

FIGS. 1A through 1E are cross-sectional views illustrating a process of fabricating a patterned conductive film according to an embodiment of the disclosure.

Figure 1A:
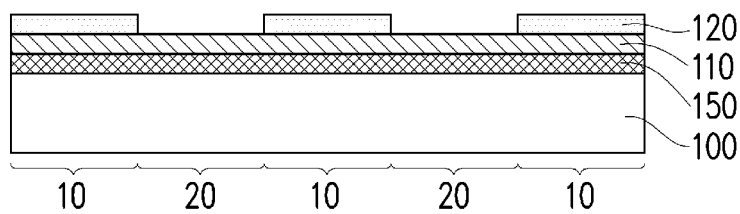
FIGS. 1A through 1E are cross-sectional views illustrating a process of fabricating a patterned conductive film according to an embodiment of the disclosure.

Referring to FIG. 1A, a substrate 100 is provided. The substrate includes a plurality of regions 10 and a plurality of regions 20. The regions 10 are adjacent to the regions 20. A material of the substrate 100 is glass, plastic or ceramic, for example. A conductive interconnected nano-structure film 110 is formed on the substrate 100. The conductive interconnected nano-structure film 110 includes a nanowire, a nanorod, a nanotube, a nano honey comb, a nanoparticle or a combination thereof. A material of the conductive interconnected nano-structure film 110 includes a metal material, a polymer material, a ceramic material, or a combination of more than two of said materials. The metal material includes gold, silver, copper, iron, tin, nickel, aluminum, titanium, platinum, tungsten, zinc or cobalt, or a multicomponent alloy thereof. The polymer material includes a polyacetylene conductive polymer material, a polythiophene conductive polymer material, a polypyrrole conductive polymer material, a polyaniline conductive polymer material or a poly(arylene vinylene) conductive polymer material. The ceramic material includes a zinc oxide, an indium oxide, a tin oxide, a titanium nitride, an indium tin oxide, an aluminum zinc oxide, an indium zinc oxide, a gallium zinc oxide or an indium gallium zinc oxide, or a multicomponent metal oxide thereof, or a multicomponent metal nitride thereof. A forming method of the conductive interconnected nano-structure film 110 can adopt an electrochemical deposition, or various wet coating methods such as a spin coating, a molding, a die coating, a roll coating or a dip coating. Details regarding above methods can refer to "Self-limited plasmonic welding of silver nanowire junctions" published by Erik C. Garnett et al., p 241-249, Vol. 11, March 2012, NATURE MATERIAL, and "Fragmentation of nanowires driven by Rayleigh instability" published by M. E. Toimil Molares et al., P 5337-5339, Vol. 85, 29 Nov. 2004, Applied Physics Letters. A thickness of the conductive interconnected nano-structure film 110 is 30 nm to 10 μm, for example.

In another embodiment, before the conductive interconnected nano-structure film 110 is formed, a release layer 150 can be formed on the regions 10 and the regions 20 of the substrate 100. A material of the release layer 150 is a parylene, an organic silicone or a silicone oil and so on, for example. The release layer 150 is formed by, for example, a spin coating, a die coating, a roll coating, a printing or a dip coating, and has a thickness of, for example, 10 Å to 10 μm.

Referring to FIG. 1A, a patterned regulating layer 120 is formed on the conductive interconnected nano-structure film 110 above the regions 10. A material of the patterned regulating layer 120 includes a resin material. The resin material includes, for example, an acrylic-based material, an epoxy-based material, a polyurethane-based material, a polyvinyl-alcohol-based material, a polyester-based material or a polyethylene-based material, or a hybrid material of more than two of the above, or an inorganic material including an aluminum oxide, a silicon oxide, a silicon nitride or a mixture thereof. The patterned regulating layer 120 is formed by, for example, forming a regulating material layer, and then patterning the regulating material layer by utilizing a photolithography process. The patterned regulating layer 120 can also be patterned by utilizing a printing process, a transferring process or a laser patterning process. A thickness of the patterned regulating layer 120 is 10 nm to 1 mm, for example.

The patterned regulating layer 120 can be made of a heat insulation material (a low thermal conductive material) or a heat absorption material (a high thermal conductive material). For example, the heat insulation material includes an acrylic-based material, an epoxy-based material, a polyurethane-based material, a polyvinyl-alcohol-based material, or a hybrid material of more than two of the above. For example, the heat absorption material includes an acrylic-based material, an epoxy-based material, a polyester-based material, a polyethylene-based material, or a hybrid material of more than two of the above.

The patterned regulating layer 120 can be a material capable of regulating light energy. The material capable of regulating light energy can be a material having light transmittance less than 50%, or a material capable of enhancing light transmittance of specific wavelength. The material having light transmittance less than 50% includes, for example, a resin material without functional groups of carbon-oxygen double bond (C=O), ether (—O—), hydroxy (—OH), a resin material containing white ceramic particles, and a resin material containing ceramic hollow spheres. The material capable of enhancing light transmittance of specific wavelength includes, for example, a material capable of enhancing a wavelength of a light source to range between 700 nm to 14 μm, which is made of a resin material containing silicon quantum dots, a resin material containing metal quantum dots, or a resin material containing metal oxide quantum dots.

The patterned regulating layer 120 can be a material capable of regulating heat energy. In an embodiment, the material capable of regulating heat energy includes a material having thermal conductivity coefficient less than 1 W/m·K, or a material having thermal insulation higher than that of glass. For example, the material having the thermal conductivity coefficient less than 1 W/m·K includes an acrylic-based material, an epoxy-based material, a polyurethane-based material, a polyvinyl-alcohol-based material, a polyester-based material or a polyethylene-based material, or a hybrid material of more than two of the above. In another embodiment, the material capable of regulating heat energy includes a material having thermal conductivity coefficient greater than 1 W/m·K, or a material having thermal insulation lower than that of glass. For example, the material having thermal conductivity coefficient greater than 1 W/m·K includes a metal/polymer composite material, a metal alloy material, or a metal oxide material such as an aluminum oxide.

The patterned regulating layer 120 can also be a material capable of performing a plasma shielding which includes, for example, an acrylic-based material, an epoxy-based material, a polyurethane-based material, a polyvinyl-alcohol-based material, a polyester-based material or a polyethylene-based material, or a hybrid material of more than two of the above. Or, the patterned regulating layer 120 can be a patternable inorganic material including a silicon oxide, a silicon nitride and so on. A plasma gas source to be shielded includes, for example, oxygen, nitrogen, argon, helium, neon, radon, krypton, chlorine, carbon tetrafluoride or sulphur hexafluoride, or a mixed gas containing more than one of the above.

Figure 1B:
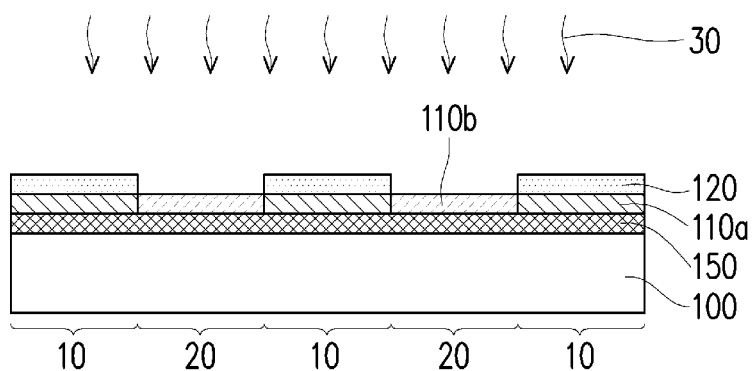

Referring FIG. 1B, a conductivity regulating treatment 30 is performed to provide an energy source to the conductive interconnected nano-structure film 110, so as to change conductivities in different regions of the conductive interconnected nano-structure film 110. As a result, a conductivity of a conductive interconnected nano-structure film 110a covered by the patterned regulating layer 120 above the regions 10 is at least 1000 times different from a conductivity of a conductive interconnected nano-structure film 110b not being covered by the patterned regulating layer 120 above the regions 20, such that a purpose of electrically patterning is achieved. In an embodiment, the conductivity of the conductive interconnected nano-structure film 110a above the regions 10 may be 1000 to ten million times different from the conductivity of the conductive interconnected nano-structure film 110b above the regions 20. In another embodiment, the conductivity regulating treatment 30 can melt and de-weld conductive materials of the conductive interconnected nano-structure film 110b to cause broken wires, so as to form a partially discontinuous interconnected nano-structure which may lower the conductivity thereof for 1000 to ten million times less. The conductivity regulating treatment 30 can be in any forms of providing an energy, such as a heat treatment process, an irradiation process or a plasma treatment process. A temperature of the heat treatment process ranges, for example, from 150° C. to 400° C., with a process time of, for example, 10 seconds to one hour. The irradiation process provides, for example, a light source with a wavelength of 700 nm to 14 µm, which can heat up a sample to 150° C. to 400° C. with a process time of 10 seconds to one hour. The plasma treatment process provides, for example, a plasma energy of 50 watts to 2000 watts with a process time of 10 seconds to 30 minutes under a gas flow rate of 100 to 1000 milliliter per minutes. In the present embodiment, the conductivity regulating treatment 30 is, for example, performed from above the patterned regulating layer 120 towards the substrate 100, namely, it is provided from above the substrate 100 down to the conductive interconnected nano-structure film 110, but the disclosure is not limited thereto.

In the conductivity regulating treatment 30, the energy (e.g., temperature, wavelength or plasma energy) and the process times are related to a line width, a particle size or a thickness of the interconnected nano-structure film 110. In an embodiment of the interconnected nano-structure film 110 with the nano-structure being the nanowire or the nano-rod, the energy and the process times for performing the conductivity regulating treatment 30 are related to the line width of the nanowire or the nano-rod. In an embodiment of the interconnected nano-structure film 110 with the nano-structure being the nanotube or the nano honey comb, the energy and the process times for performing the conductivity regulating treatment 30 are related to the thickness of the nanotube or the nano honey comb. In an embodiment of the interconnected nano-structure film 110 with the nano-structure being the nanoparticle, the energy and the process times for performing the conductivity regulating treatment 30 are related to the particle size of the nanoparticle. Details regarding above can refer to content disclosed in "Self-limited plasmonic welding of silver nanowire junctions" published by Erik C. Garnett et al., p 241-249, Vol. 11, March 2012, *NATURE MATERIAL*, and said content is incorporated herein for reference.

In an embodiment with the conductivity regulating treatment 30 being the heat treatment process while the patterned regulating layer 120 above the regions 10 being the heat insulation material, the heat insulation material can block most of the heat energy provided by the heat treatment process, so as to reduce influences of the heat treatment process to the conductive interconnected nano-structure film 110 below the patterned regulating layer 120. For the conductive interconnected nano-structure film 110a contacting the patterned regulating layer 120 above the regions 10, since arrangement and distribution of the nano-structure thereof are fixed or adhered by the patterned regulating layer 120, the nano-structure can maintain an interconnected nano-structure network without being broken, shorten or becoming a nanosphere. The conductive interconnected nano-structure film 110b not being covered by the patterned regulating layer 120 above the regions 20 can be melt and de-weld to cause broken wires thereon by the heat energy provided by the heat treatment process, such that the partially discontinuous interconnected nano-structure is formed and the conductivity thereof is lowered to at least 1000 times less. That is, after the heat treatment process is completed, the conductivity of the conductive interconnected nano-structure film 110a left above the regions 10 is at least 1000 times the conductivity of the conductive interconnected nano-structure film 110b above the regions 20. In another embodiment with the conductivity regulating treatment 30 being the heat treatment process while the patterned regulating layer 120 above the regions 10 being the heat absorption material or high thermal conductive material, the heat absorption material can absorb the heat energy provided by the heat treatment process, and conduct the same to the conductive interconnected nano-structure film 110a below, so it is melted and de-welded to cause broken wires thereon for lowering the conductivity thereof to at least 1000 times less. That is, after the heat treatment process is completed, the conductivity of the conductive interconnected nano-structure film 110a left above the regions 10 may be 1/1000 of the conductivity of the conductive interconnected nano-structure film 110b above the regions 20.

In another embodiment, the conductivity regulating treatment 30 is the heat treatment process while the patterned regulating layer 120 above the regions 10 is the material capable of regulating heat energy. In an embodiment, the material capable of regulating heat energy includes the material having thermal conductivity coefficient less than 1 W/m·K, or the material having thermal insulation higher than that of glass, such as an acrylic photoresist material and so on. Due to low thermal conductivity coefficient or high thermal insulation of the patterned regulating layer 120 above the regions 10, the heat energy provided by the heat treatment process cannot be conducted, or can be conducted in a slow speed to the patterned regulating layer 120 and then conducted to the conductive interconnected nano-structure film 110*a* below, whereas the conductive interconnected nano-structure film 110*b* not being covered by the patterned regulating layer 120 above the regions 20 is melted and de-welded to cause broken wires thereon by the heat energy provided by the heat treatment process, so that the conductivity thereof is lowered to at least 1000 times less. That is, after the heat treatment process is completed, the conductivity of the conductive interconnected nano-structure film 110*a* left above the regions 10 is at least 1000 times the conductivity of the conductive interconnected nano-structure film 110*b* above the regions 20.

In another embodiment, the conductivity regulating treatment 30 is the heat treatment process while the patterned regulating layer 120 above the regions 10 is the material capable of regulating heat energy. In an embodiment, the material capable of regulating heat energy includes the material having thermal conductivity coefficient greater than 1 W/m·K, or a metal oxide material having thermal insulation lower than that of glass, such as the aluminum oxide and so on. Due to high thermal conductivity coefficient or lower thermal insulation of said material capable of regulating heat energy, the heat energy provided by the heat treatment process can be rapidly conducted to the patterned regulating layer 120 and then conducted to the conductive interconnected nano-structure film 110*a* below, so that it is melted and de-welded to cause broken wires thereon. As a result, after the heat treatment process is completed, the partially discontinuous interconnected nano-structure is formed on the conductive interconnected nano-structure film 110*a* above the regions 10, and the interconnected nano-structure network is maintained on the conductive interconnected nano-structure film 110*b* above the regions 20. In an embodiment, the conductivity of the conductive interconnected nano-structure film 110*a* above the regions 10 may be ¹⁄₁₀₀₀ of the conductivity of the conductive interconnected nano-structure film 110*b* above the regions 20.

In yet another embodiment, the conductivity regulating treatment 30 is the irradiation process while the patterned regulating layer 120 above the regions 10 is the material capable of regulating light energy, and the material capable of regulating light energy is the material having light transmittance less than 50%. The material having low light transmittance can block most of the light energy provided by the irradiation process, so that the light energy is not conducted, or partially conducted to the patterned regulating layer 120 and then to the conductive interconnected nano-structure film 110*a* below, thus the interconnected nano-structure network can be maintained. The conductive interconnected nano-structure film 110*b* not being covered by the patterned regulating layer 120 above the regions 20 can be melt and de-weld to cause broken wires thereon by the light energy provided by the irradiation process, such that the partially discontinuous interconnected nano-structure is formed. As a result, after the irradiation process is completed, the conductivity of the conductive interconnected nano-structure film 110*a* left above the regions 10 is at least 1000 times the conductivity of the conductive interconnected nano-structure film 110*b* above the regions 20.

In another embodiment, the conductivity regulating treatment 30 is the irradiation process while the patterned regulating layer 120 above the regions 10 is the material capable of regulating light energy, and the material capable of regulating light energy is the material capable of enhancing light transmittance of specific wavelength. The material capable of enhancing light transmittance of specific wavelength can enhance a specific wavelength of the light source (e.g., an infrared light) provided by the irradiation process to the conductive interconnected nano-structure film 110*a* below the patterned regulating layer 120, so it is easily melted and de-welded to cause broken wires thereon to form the partially discontinuous interconnected nano-structure. As a result, after the irradiation process is completed, the conductivity of the conductive interconnected nano-structure film 110*a* above the regions 10 may be ¹⁄₁₀₀₀ of the conductivity of the conductive interconnected nano-structure film 110*b* above the regions 20.

In other embodiments, the conductivity regulating treatment 30 is the plasma treatment process. The plasma gas source used in the plasma treatment process includes, for example, oxygen, nitrogen, argon, helium, neon, radon, krypton, chlorine, carbon tetrafluoride or sulphur hexafluoride, or a mixed gas containing more than one of the above. The patterned regulating layer 120 above the regions 10 can also be the material capable of performing the plasma shielding.

The plasma gas is blocked by the material capable of performing the plasma shielding, so that the conductive interconnected nano-structure film 110*a* below the patterned regulating layer 120 is not processed, or merely processed by a small part or of the plasma, thus the interconnected nano-structure network can be maintained. The conductive interconnected nano-structure film 110*b* not being covered by the patterned regulating layer 120 above the regions 20 can be melt and de-weld to cause broken wires thereon by the plasma provided by the plasma treatment process, such that the partially discontinuous interconnected nano-structure is formed. As a result, after the plasma treatment process is completed, the conductivity of the conductive interconnected nano-structure film 110*a* above the regions 10 is at least 1000 times the conductivity of the conductive interconnected nano-structure film 110*b* above the regions 20.

Figure 1C:
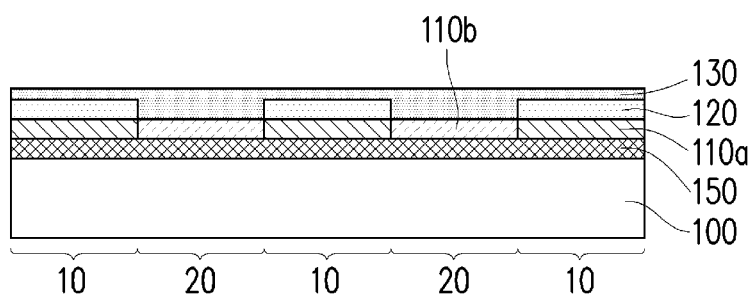

Referring to FIG. 1C, after the conductivity regulating treatment 30 is completed, the patterned regulating layer 120 can be left or removed. In the present embodiment, the patterned regulating layer 120 is left. A planar layer (or a protective layer) 130 is formed on the patterned regulating layer 120 and the conductive interconnected nano-structure film 110*b*. For example, a material of the planar layer (or the protective layer) 130 includes an acrylic-based material, an epoxy-based material, a polyurethane-based material, a poly-vinyl-alcohol-based material, a polyester-based material or a polyethylene-based material, or a hybrid material of more than two of the above. The planar layer (or the protective layer) 130 is formed by, for example, a spin coating, a die coating, a roll coating, a printing or a dip coating, and has a thickness of, for example, 10 nm to 1 μm.

Figure 1D:
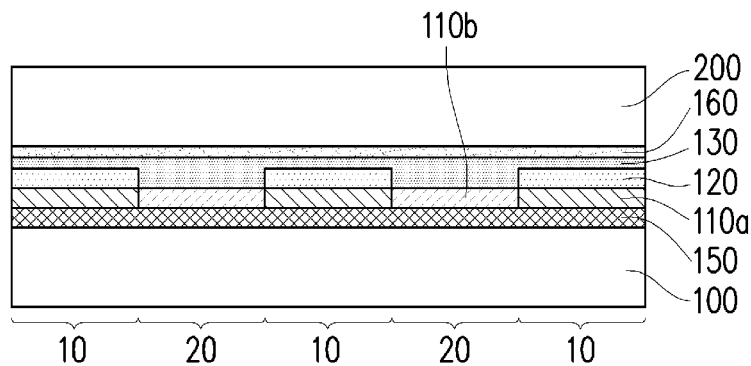

Referring to FIG. 1D, in an embodiment, an adhesion layer 160 can be further formed on the planar layer (or the protective layer) 130, and another substrate 200 is further adhered onto the adhesion layer 160. The adhesion layer 160 can be a polystyrene resin, an acrylonitrile-butadiene-styrene copolymer resin, a polypropylene resin, a polyethylene resin, cyanoacrylate or poly(vinyl acetate). A material of the substrate 200 is glass, plastic or ceramic, for example.

Figure 1E:
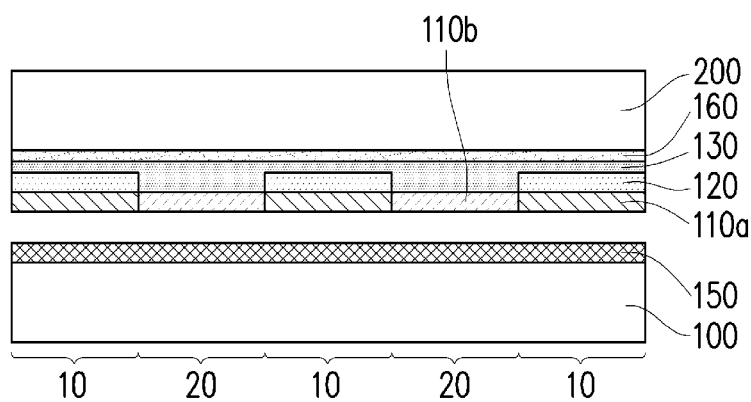

Referring to FIG. 1E, a releasing process is performed. By using the release layer 150, the substrate 100 is released from the substrate 200 adhered with the patterned regulating layer 120 and the conductive interconnected nano-structure films 110*a* and 110*b*. The release layer 150 can be left on the substrate 100 (as shown in FIG. 1E), or left on the substrate 200 (not illustrated).

In the foregoing embodiment, before the releasing process is performed, the another substrate 200 is already adhered onto the adhesion layer 160. However, the disclosure is not limited thereto. In another embodiment, the substrate 200 (FIG. 1D) can be adhered onto the adhesion layer 160 after the releasing process is completed. In yet another embodiment, the substrate 100 can be separated without using the release layer 150.

Figure 2A:
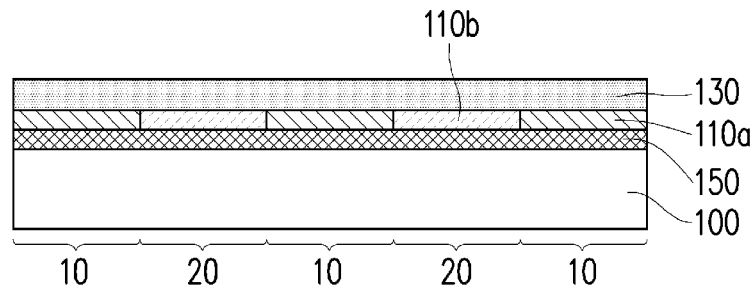
FIGS. 2A through 2C are cross-sectional views illustrating a process of fabricating a patterned conductive film according to another embodiment of the disclosure.
Figure 2B:
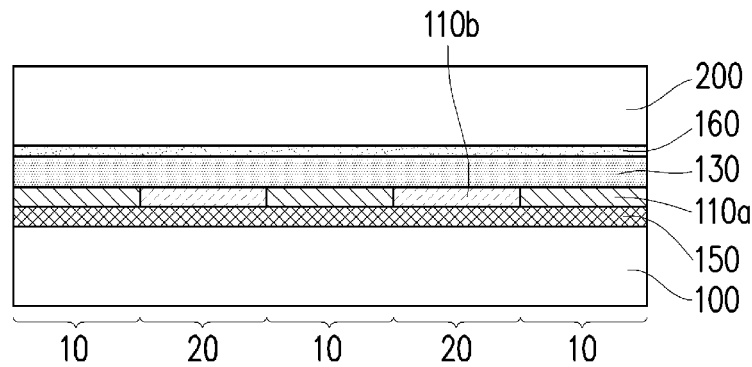
Figure 2C:
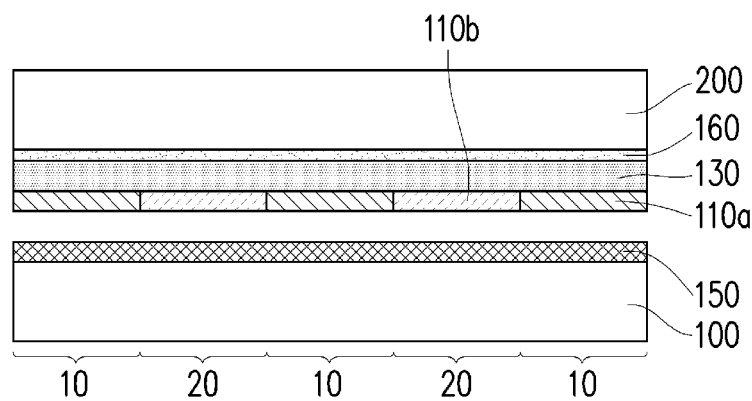

FIGS. 2A through 2C are cross-sectional views illustrating a process of fabricating a patterned conductive film according to another embodiment of the disclosure.

In the foregoing embodiments with reference to FIG. 1A through FIG. 1E, after the conductivity regulating treatment 30 is completed, the patterned regulating layer 120 is left (FIG. 1B). Referring to FIG. 2A, after the conductivity regulating treatment 30 is completed, the patterned regulating layer 120 can be removed. The planar layer (or the protective layer) 130 and the adhesion layer 160 are formed, and substrate 200 is further adhered onto the adhesion layer 160, as shown in FIG. 2B. Referring to FIG. 2C, the releasing process is performed. By using the release layer 150, the substrate 100 is released from the substrate 200 adhered with the conductive interconnected nano-structure films 110*a* and 110*b*.

In another embodiment, the substrate 200 (FIG. 2B) can be adhered onto the adhesion layer 160 after the releasing process is completed. In yet another embodiment, the substrate 100 can be separated without using the release layer 150.

FIGS. 3A through 3F are cross-sectional views illustrating a process of fabricating a patterned conductive film according to yet another embodiment of the disclosure.

Figure 3A:
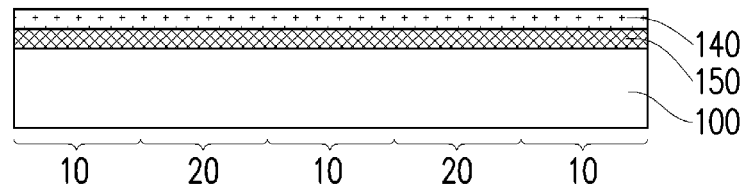
FIGS. 3A through 3F are cross-sectional views illustrating a process of fabricating a patterned conductive film according to yet another embodiment of the disclosure.

Referring to FIG. 3A, in another embodiment, when the substrate 100 is made of a material without thermal tolerance or irradiation tolerance (e.g., polyethylene terephthalate or polyfluoro diethylene), a heat-resist layer 140 can be previously formed on the release layer 150, so as to prevent the substrate 100 from deforming in the subsequent process of the conductivity regulating treatment 30. For example, a material of the heat-resist layer 140 includes an acrylic-based material, an epoxy-based material, a polyurethane-based material, a polyvinyl-alcohol-based material, a polyester-based material or a polyethylene-based material, or a hybrid material of more than two of the above. The heat-resist layer 140 is formed by, for example, a spin coating, a die coating, a roll coating or a dip coating, and has a thickness of, for example, 10 nm to 1 mm.

Referring to FIGS. 3B through 3F, subsequent steps therein can refer to the foregoing embodiments with reference to FIG. 1A through FIG. 1E, thus related description is omitted hereinafter.

In another embodiment, the another substrate 200 (FIG. 3E) can be adhered onto the adhesion layer 160 after the releasing process is completed. In yet another embodiment, the substrate 100 can be separated without using the release layer 150.

Figure 4A:
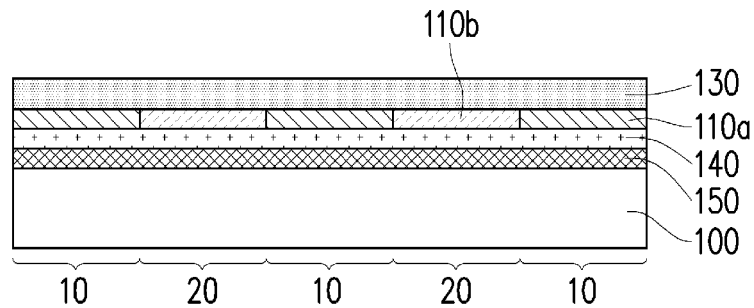
FIGS. 4A through 4C are cross-sectional views illustrating a process of fabricating a patterned conductive film according to still another embodiment of the disclosure.
Figure 4B:
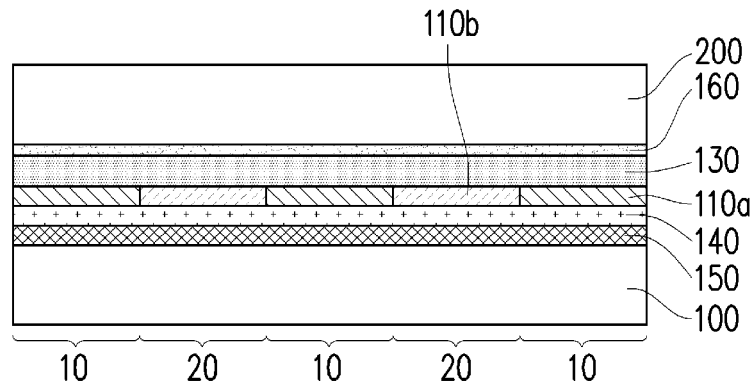
Figure 4C:
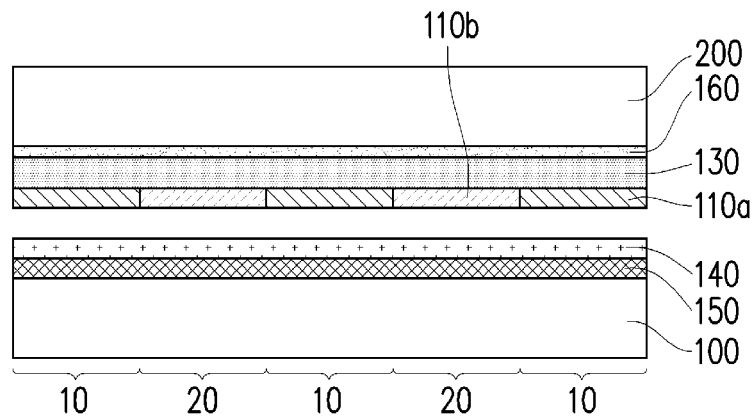

FIGS. 4A through 4C are cross-sectional views illustrating a process of fabricating a patterned conductive film according to still another embodiment of the disclosure.

In the foregoing embodiments with reference to FIGS. 3A through 3F, after the conductivity regulating treatment 30 is completed, the patterned regulating layer 120 (FIG. 3C) is left. Referring to FIG. 4A, after the conductivity regulating treatment 30 is completed, the patterned regulating layer 120 can be removed. The planar layer (or the protective layer) 130 is formed. The adhesion layer 160 can be further formed on the planar layer (or the protective layer) 130, and another substrate 200 is further adhered onto the adhesion layer 160, as shown in FIG. 4B. Referring to FIG. 4C, the releasing process is performed. By using the release layer 150, the substrate 100 is released from the substrate 200 adhered with the conductive interconnected nano-structure films 110*a* and 110*b*. In another embodiment, the another substrate 200 (FIG. 4B) can be adhered onto the adhesion layer 160 after the releasing process is completed. In yet another embodiment, the substrate 100 can be separated without using the release layer 150.

Figure 3B:
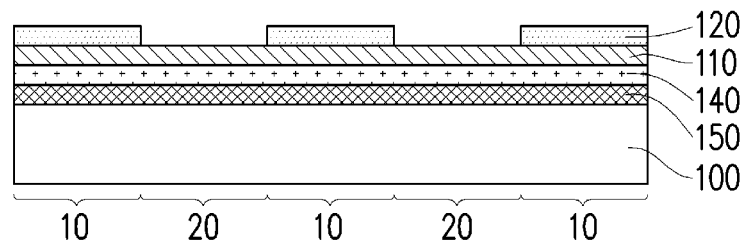
Figure 3C:
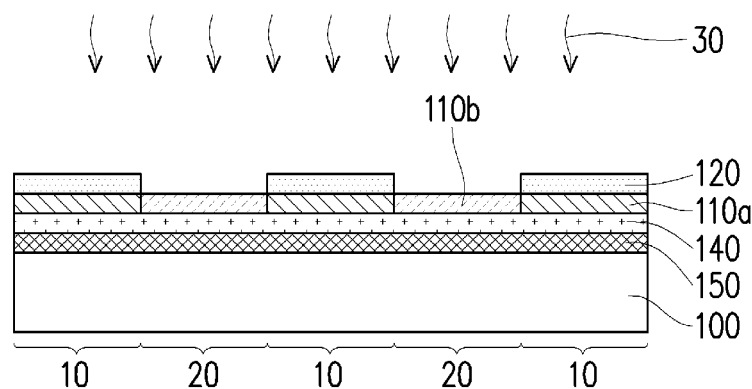
Figure 3D:
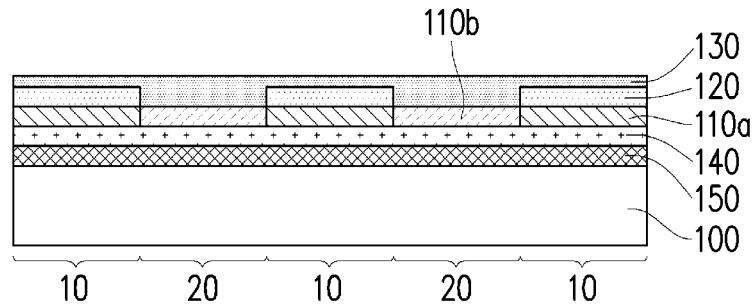
Figure 3E:
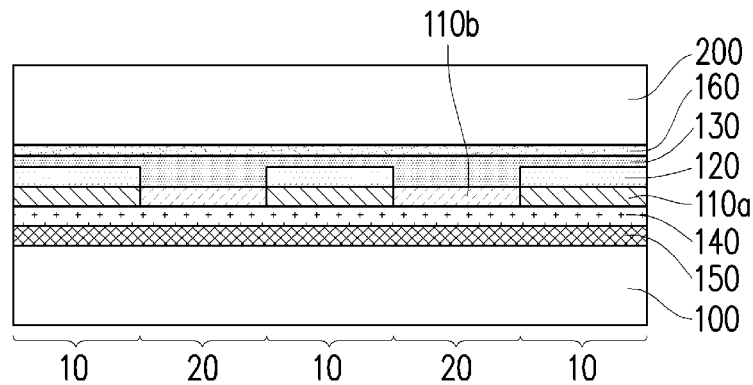
Figure 3F:
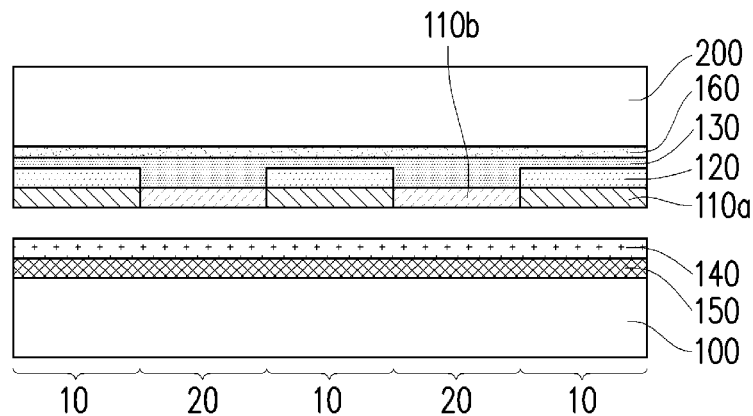

In the foregoing embodiments, referring to FIGS. 1A and 3B, the patterned regulating layer 120 is formed on the conductive interconnected nano-structure film 110. However, the disclosure is not limited thereto. In other embodiments, the patterned regulating layer 120 can also be formed below the conductive interconnected nano-structure film 110. An embodiment is given for illustration below.

Figure 5A:
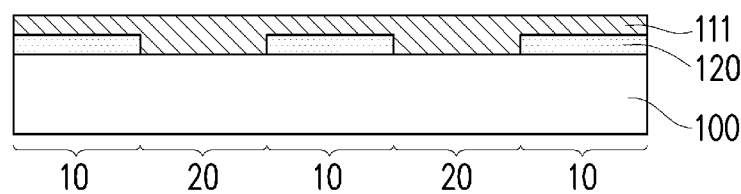
FIGS. 5A through 5C are cross-sectional views illustrating a process of fabricating a patterned conductive film according to yet another embodiment of the disclosure.
Figure 5B:
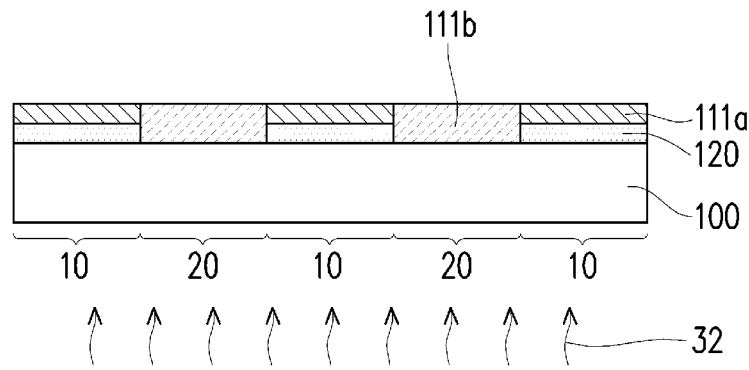
Figure 5C:
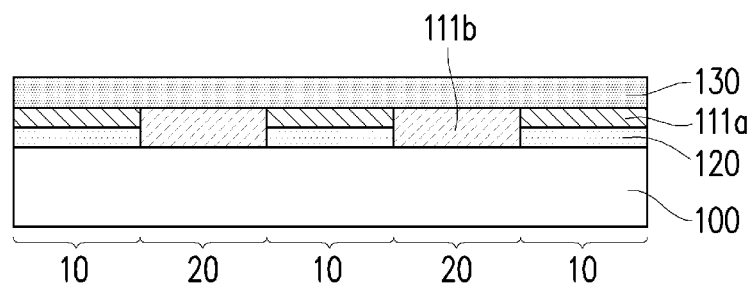

FIGS. 5A through 5C are cross-sectional views illustrating a process of fabricating a patterned conductive film according to yet another embodiment of the disclosure.

Referring to FIG. 5A, the patterned regulating layer 120 is formed on the substrate 100 before a conductive interconnected nano-structure film 111 is formed on the substrate 100. The conductive interconnected nano-structure film 111 is formed on the substrate 100 and the patterned regulating layer 120. The material, the forming method or the patterning method for the substrate 100, the patterned regulating layer 120 and the conductive interconnected nano-structure film 111 are identical to the same in the foregoing embodiments, thus related description is omitted hereinafter.

Referring to FIG. 5B, a conductivity regulating treatment 32 is performed to the conductive interconnected nano-structure film 111 and the patterned regulating layer 120, so that a conductivity of a conductive interconnected nano-structure film 111*a* of the regions 10 is at least 1000 times different from a conductivity of a conductive interconnected nano-structure film 111*b* of the regions 20. The conductivity regulating treatment 32 is, for example, performed from the substrate 100 towards the conductive interconnected nano-structure film 111, namely, it is provided from below the substrate 100 up to the conductive interconnected nano-structure film 111. The conductivity regulating treatment 32 can be in any forms of providing an energy from a heat source, such as a heat treatment process, an irradiation process or a plasma treatment process. The conductivity regulating treatment 32 can make conductive materials of a part of the conductive interconnected nano-structure film 111 to be melt and de-weld to cause broken wires. The heat treatment process, the irradiation process or the plasma treatment process, as well as material characteristics, effects and principles of the patterned regulating layer 120 are identical to the same in the foregoing embodiments, thus related description is omitted hereinafter.

Referring to FIG. 5C, the planar layer (or the protective layer) 130 is formed on the conductive interconnected nano-structure film 111. The material, the forming method and the thickness of the planar layer (or the protective layer) 130 are identical to the same in the foregoing embodiments.

In the foregoing embodiments, it is illustrated using a single layer of patterned conductive interconnected nano-structure film formed on the substrate as an example. However, the disclosure is not limited thereto. In other embodiments, after a first layer of patterned conductive interconnected nano-structure film is formed, a planar layer can first be formed on the first layer of patterned conductive interconnected nano-structure film. Thereafter, a second layer of patterned conductive interconnected nano-structure film is formed on the planar layer to form a stacked layer formed by multiple layers of the patterned conductive interconnected nano-structure films, so as to achieve purposes in different applications.

For instance, concept of the disclosure can be applied on a touch panel, in which the patterned regulating layer is first formed on the conductive interconnected nano-structure film, and then the conductivity regulating treatment is utilized to perform patterning of the conductive interconnected nano-structure film so as to complete fabricating of a touch sensor electrode. Said concept can be applied in the touch panel adopting either a glass/film dual ITO thin-film structure GF2 (DITO) design or a glass/film single ITO thin-film structure GF2(SITO) design.

FIGS. 6A through 6H are top views illustrating a fabricating method of a touch panel of glass/film dual ITO thin-film structure GF2(DITO) according to an embodiment of disclosure.

Figure 6A:
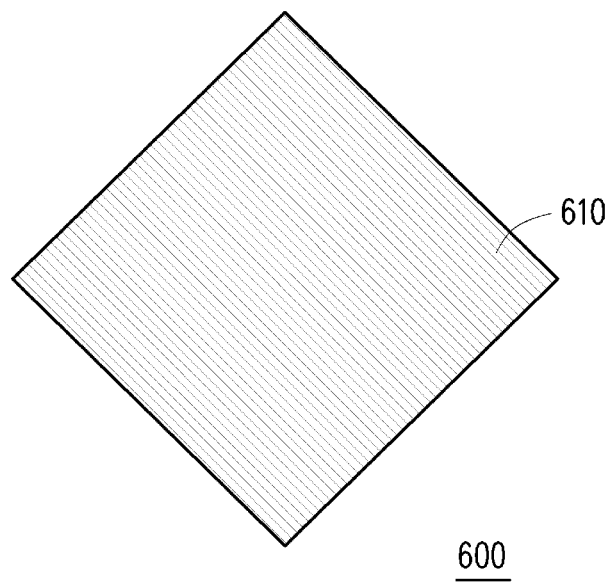
FIGS. 6A through 6H are top views illustrating a fabricating method of a touch panel of glass/film dual ITO thin-film structure GF2(DITO) according to an embodiment of disclosure.
Figure 6B:
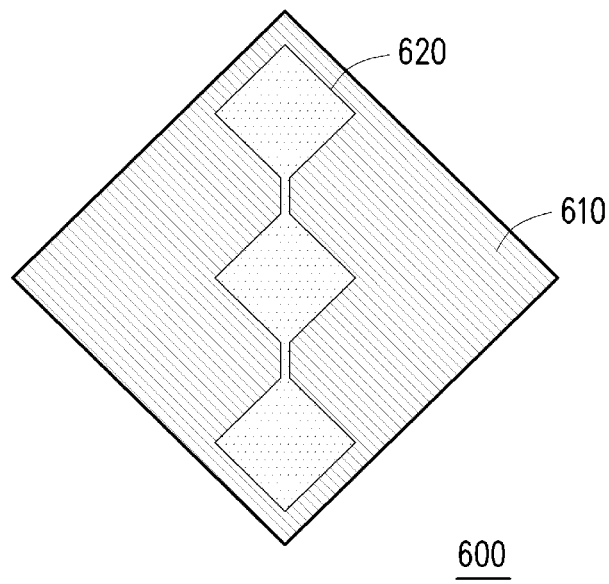

Referring to FIG. 6A, a conductive interconnected nano-structure film 610 (e.g., a silver nanowire film) is coated and formed on a substrate 600. Referring to FIG. 6B, a Y-axis patterned regulating layer 620 is formed on the conductive interconnected nano-structure film 610.

Figure 6C:
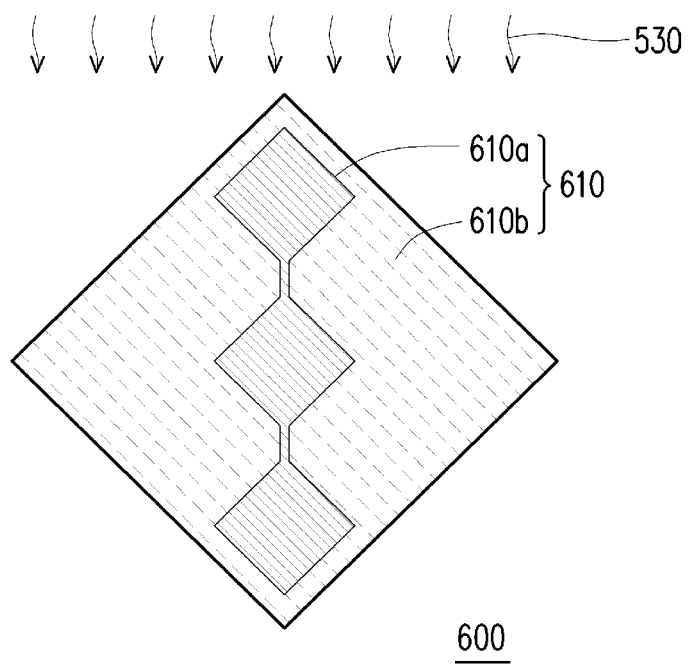

Referring to FIG. 6C, a conductivity regulating treatment 530 (e.g., a thermal baking) is performed, so that region on which the conductive interconnected nano-structure film covered by the patterned regulating layer 620 forms a Y-axis electrode pattern 610a, and having low conductive regions 610b formed on regions nearby. Then, the patterned regulating layer 620 is removed, and the Y-axis electrode pattern 610a is exposed.

Figure 6D:
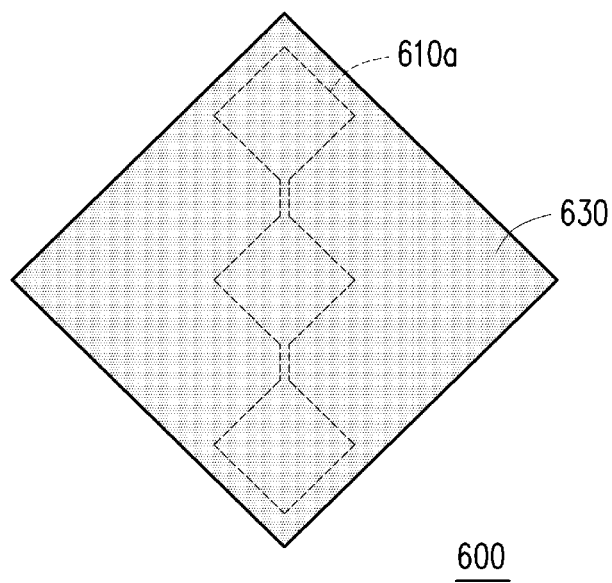
Figure 6E:
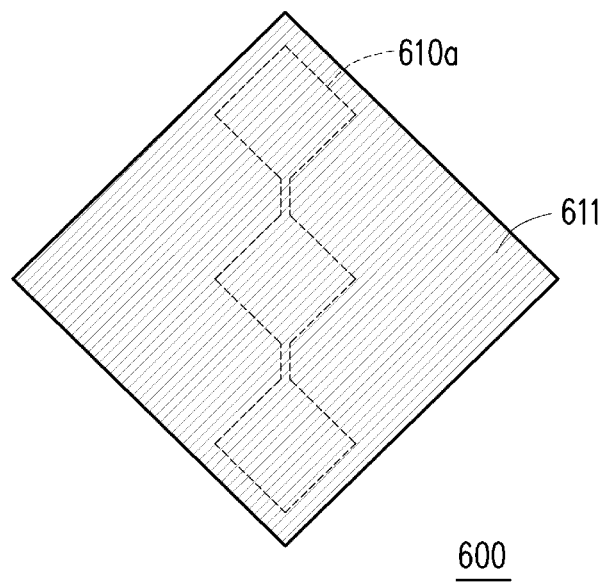
Figure 6F:
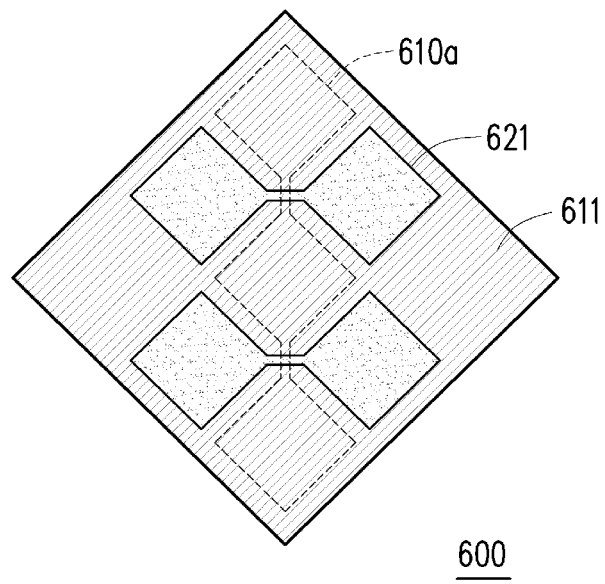

Referring to FIG. 6D, a planar layer 630 is formed on the substrate 600. Referring to FIG. 6E, another conductive interconnected nano-structure film 611 is formed on the planar layer 630. Referring to FIG. 6F, a X-axis patterned regulating layer 621 is formed on the conductive interconnected nano-structure film 611.

Figure 6G:
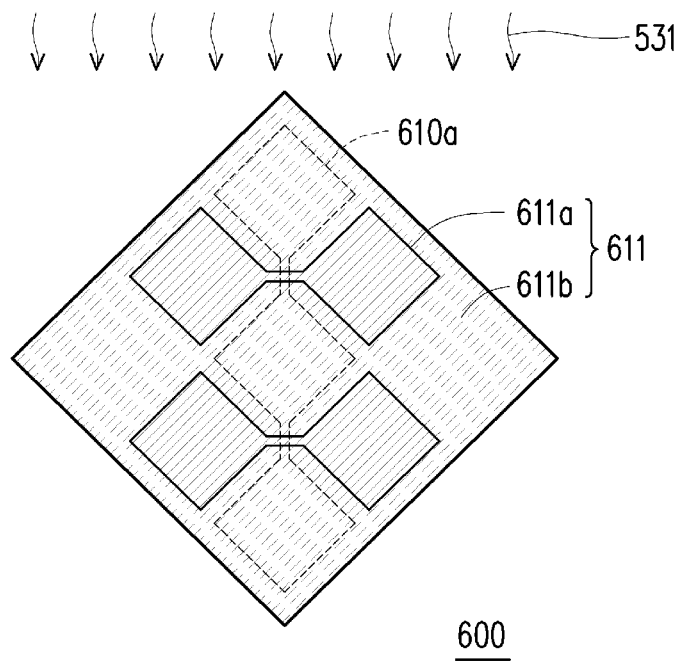
Figure 6H:
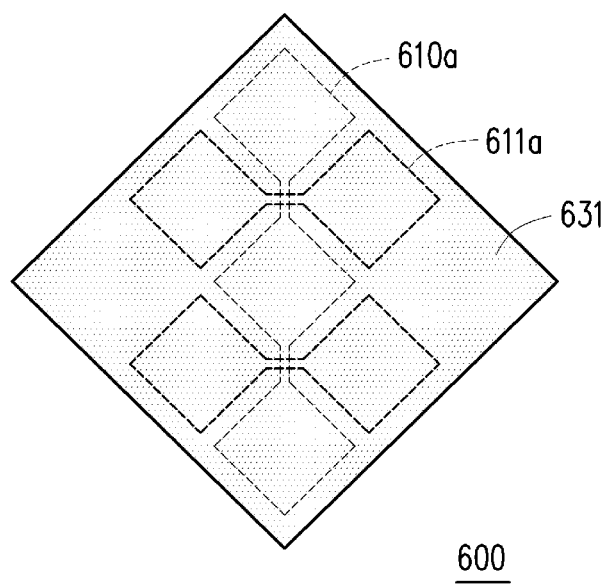

Referring to FIG. 6G, a conductivity regulating treatment 531 (e.g., a thermal baking) is performed, so that regions on which the conductive interconnected nano-structure film is covered by the patterned regulating layer 621 form a X-axis electrode pattern 611a, and having low conductive regions 611b formed by the conductive interconnected nano-structure film on regions nearby. Then, the patterned regulating layer 621 is removed, and the X-axis electrode pattern 611a is exposed. Referring to FIG. 6H, a protective layer 631 is formed on the substrate 600.

Referring FIG. 6C, FIG. 6G and FIG. 6H, the touch panel of glass/film dual ITO thin-film structure GF2(DITO) includes, from bottom to top, the substrate 600, the conductive interconnected nano-structure film 610, the planar layer 630, the another conductive interconnected nano-structure film 611 and the protective layer 631.

Referring to FIG. 6C, the conductive interconnected nano-structure film 610 includes the Y-axis electrode pattern (or also known as a first direction electrode pattern) 610a and the low conductive regions 610b. The Y-axis electrode pattern 610a has an interconnected nano-structure network. The low conductive regions 610b have a partially discontinuous interconnected nano-structure. A conductivity of the Y-axis electrode pattern 610a is at least 1000 times a conductivity of the low conductive regions 610b.

Referring to FIG. 6G, the another conductive interconnected nano-structure film 611 includes the X-axis electrode pattern (or also known as a second direction electrode pattern) 611a and the low conductive regions 611b. The X-axis electrode pattern 611a has an interconnected nano-structure network. The low conductive regions 611b have a partially discontinuous interconnected nano-structure. A conductivity of the X-axis electrode pattern 611a is at least 1000 times a conductivity of the low conductive regions 611b.

Referring to FIGS. 6C, 6D and 6E, the planar layer 630 is located between the conductive interconnected nano-structure film 610 and the another conductive interconnected nano-structure film 611. Referring to FIG. 6H, the protective layer 631 covers on the another conductive interconnected nano-structure film 611 above the substrate 600.

In the touch panel of glass/film dual ITO thin-film structure GF2(DITO) as described above, after the conductivity regulating treatments 530 and 531 are respectively performed to the interconnected nano-structure films 610 and 611, the low conductive regions 610b and 611b are left without being etch-dissolved or removed, thus it shows no optical difference under macroscopic. The visible etching marks are not left.

FIGS. 7A through 7F are top views illustrating a fabricating method of a touch panel of glass/film single ITO thin-film structure GF2(SITO) according to an embodiment of disclosure.

Figure 7A:
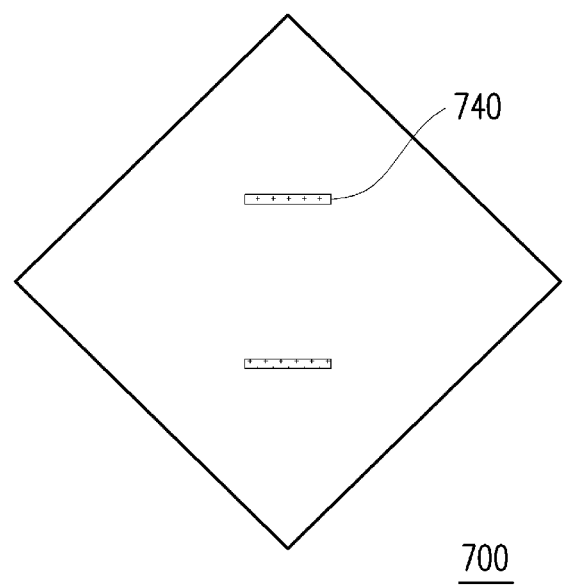
FIGS. 7A through 7F are top views illustrating a fabricating method of a touch panel of glass/film single ITO thin-film structure GF2(SITO) according to an embodiment of disclosure.

Referring to FIG. 7A, a X-axis bridge electrode pattern 740 is first formed on a substrate 700. A material of the X-axis bridge electrode pattern 740 can be a transparent conductive oxide, such as indium tin oxide (ITO), conductive polymer, carbon nanotube, metal or metal nanowire. A patterning method for the X-axis bridge electrode pattern 740 includes, for example, a photolithography process, a printing process, a transforming process, a laser patterning process, or the processes used in the patterned conductive film utilizing the patterned regulating layer in foregoing embodiments.

Figure 7B:
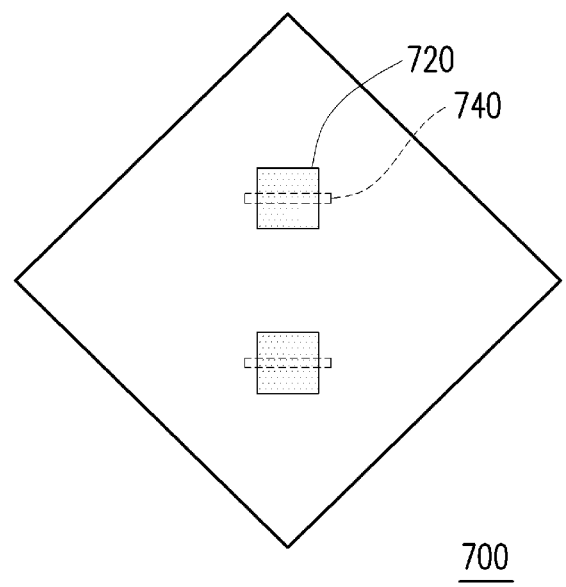

Referring to FIG. 7B, a patterned insulating layer 720 (e.g., which can be transparent) is formed on a surface of the substrate 700. The patterned insulating layer 720 covers a part of the X-axis direction bridge electrode pattern 740 and exposes two ends of the X-axis direction bridge electrode pattern 740. For example, a material of the patterned insulating layer 720 includes an acrylic-based material, an epoxy-based material, a polyurethane-based material, a polyvinyl-alcohol-based material, a polyester-based material or a polyethylene-based material, or a hybrid material of more than two of the above. The patterned insulating layer 720 is formed by, for example, a spin coating, a die coating, a roll coating or a dip coating. A patterning method for the patterned insulating layer 720 includes, for example, a photolithography process, a printing process, a transferring process and a laser patterning process.

Figure 7C:
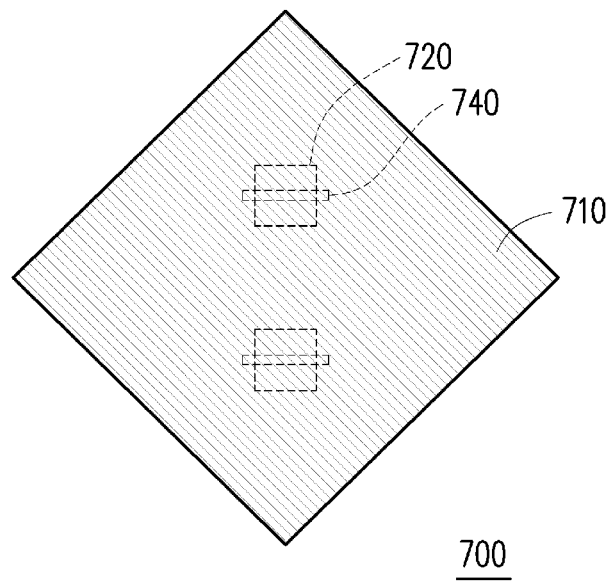
Figure 7D:
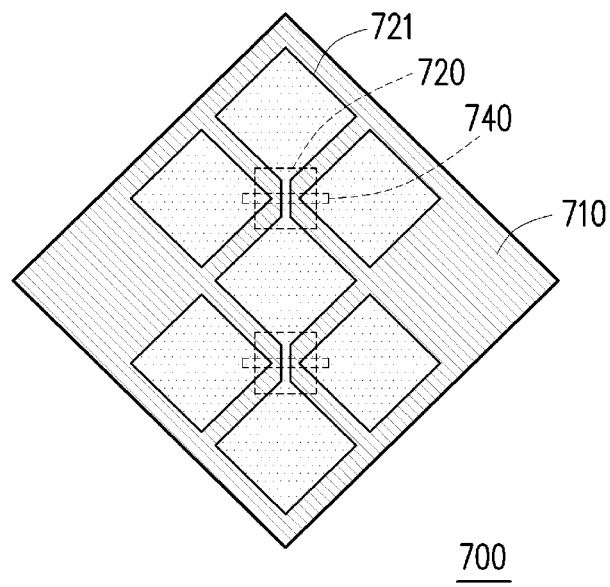

Referring to FIG. 7C, a conductive interconnected nano-structure film 710 (e.g., a silver nanowire film) is formed on a substrate 700. Referring to FIG. 7D, a patterned regulating layer 721 is formed on the conductive interconnected nano-structure film 710.

Figure 7E:
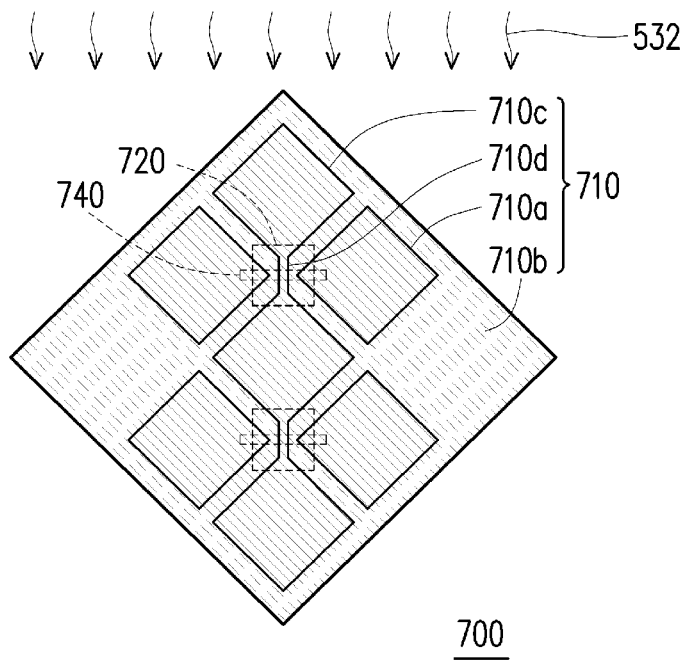

Referring to FIG. 7E, a conductivity regulating treatment 532 (e.g., a thermal baking) is performed, so that regions on which the conductive interconnected nano-structure film is covered by the patterned regulating layer 721 form a X-axis electrode pattern 710a, a Y-axis electrode pattern 710c and a Y-axis bridge electrode pattern 710d, and having low conductive regions 710b formed by the conductive interconnected nano-structure film on regions nearby. The X-axis electrode pattern 710a is electrically connected to the two ends of the X-axis bridge electrode pattern 740 below, which is not covered by the patterned insulating layer 720. Each end of the Y-axis bridge electrode pattern 710d is electrically connected to the Y-axis electrode pattern 710c, and the Y-axis bridge electrode pattern 710d is electrically insulated from the X-axis bridge electrode pattern 740 below by the patterned insulating layer 720.

Figure 7F:
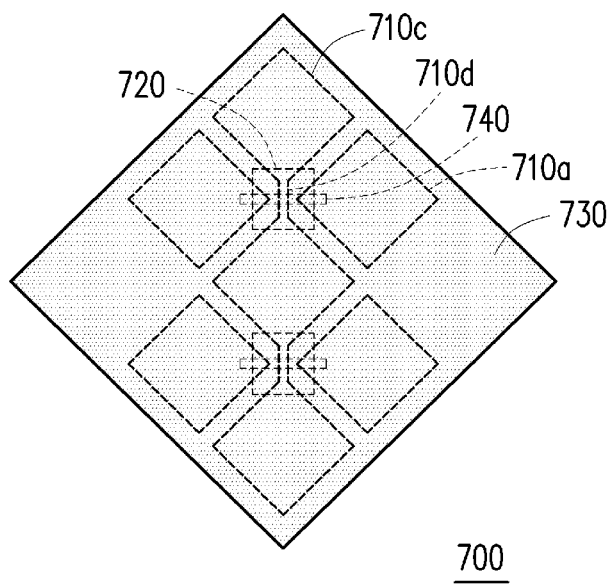

Then, the patterned regulating layer 721 is removed. Referring to FIG. 7F, a protective layer 730 is formed on the substrate 700.

Referring FIG. 7B, FIG. 7E and FIG. 7F, the touch panel of glass/film single ITO thin-film structure GF2(SITO) includes, from bottom to top, the substrate 700, the X-axis bridge electrode pattern 740, the patterned insulating layer 720, the conductive interconnected nano-structure film 710 and the protective layer 730.

Referring to FIGS. 7A and 7B, the X-axis bridge electrode pattern (or also known as a first direction bridge electrode pattern) 740 is located on the substrate 700. The patterned insulating layer 720 covers a part of the X-axis direction bridge electrode pattern 740 and exposing two ends of the X-axis direction bridge electrode pattern 740.

Referring to FIG. 7E, the conductive interconnected nano-structure film 710 includes three regions. Among them, a first region is a second direction electrode pattern including the Y-axis electrode pattern 710c and the Y-axis bridge electrode pattern 710d. A second region is the low conductive regions 710b. A third region is a first direction electrode pattern including two parts located at two sides of the Y-axis electrode pattern 710c and served as the X-axis electrode pattern 710a. The X-axis electrode pattern 710a is electrically connected to the two ends of the X-axis bridge electrode pattern 740 below, which is not covered by the patterned insulating layer 720. Each end of the Y-axis bridge electrode pattern 710d is electrically connected to the Y-axis electrode pattern 710c, and the Y-axis bridge electrode pattern 710d is electrically insulated from the X-axis bridge electrode pattern 740 below by the patterned insulating layer 720. The X-axis electrode pattern 710a, the Y-axis electrode pattern 710c and the Y-axis bridge electrode pattern 710d have the interconnected nano-structure network. The low conductive regions 710b have the partially discontinuous interconnected nano-structure. Conductivities of the X-axis electrode pattern 710a, conductivities of the Y-axis electrode pattern 710c and the Y-axis bridge electrode pattern 710d are at least 1000 times a conductivity of the low conductive regions 710b.

Referring to FIG. 7F, the protective layer 730 covers the conductive interconnected nano-structure film 710.

In the touch panel of glass/film single ITO thin-film structure GF2(SITO) as described above, after the conductivity regulating treatment 532 is performed to the interconnected nano-structure film 710, the low conductive regions 710b may be left without being etch-dissolved or removed, thus it shows no optical difference under macroscopic. The visible etching marks are not left.

In case the concept of the embodiments of the disclosure is applied to the touch panel, if a dry patterning process can be adopted, and a printing technology is used in the regulating layer and the touch sensor bridge electrode, the costs thereof can be lowered. In addition, the silver nanowire may provide high conductivity and an element structure being flexible without visible etching marks.

In short, visible etching marks on the common patterned conductive film are caused by the conductive film on an etching region being etch-dissolved, such that the etching region and a non-etching region may have differences in colors or transmittance. The reason that no visible etching marks are left by using the patterning method of the disclosure is because the conductivity regulating treatment is performed by using energy sources such as heat, light or plasma, so as to reduce conductivities of specific regions on the conductive film. For instance, an alternatively overlapped morphology of the conductive interconnected nano-structure film is altered (destroyed) to generate a partially discontinuous phase. For example, the nanowire being alternatively overlapped or in a network shape is converted into a partially discontinuous nanosphere. Or, said nanowire is broken or shorten, so that different effects of high conductivity and low conductivity can be shown respectively in energy processing regions and non-processing regions. Also, since the interconnected nano-structure film being processed with energy is not etch-dissolved or removed, thus it shows no optical difference under macroscopic. Moreover, no chemical (such as etchants) is required in the disclosure, so that a problem of dealing with metal waste is avoided so as to further reduce environmental pollution. In an embodiment, since arrangement and distribution of the nano-structure are fixed or adhered by the regulating layer, the nanowire can be provided without being broken, shorten or becoming a nanosphere. After being processed with the same temperature or heat source, the interconnected nano-structure film contacting the regulating layer and the interconnected nano-structure film not contacting the regulating layer may have differences in electrical property. According to another embodiment, the regulating layer (such as the regulating layer with heat absorption or high thermal conductivity) can speed up damaging to the nano-structure during the conductivity regulating treatment with the energy source.

Examples 1-8

A substrate is coated with a silver nanowire film, and entire surface of the silver nanowire film is baked with different time and different temperatures. Sheet resistances before backing and after baking are measured, and results thereof are listed in Table 1 below.

TABLE 1

| | Example | | | | | | | |
|---|---|---|---|---|---|---|---|---|
| | 1 | 2 | 3 | 4 | 5 | 6 | 7 | 8 |
| Heating Temperature | 180 | 190 | 195 | 200 | 200 | 200 | 200 | 200 |
| Time (min) | 30 | 30 | 5 | 30 | 10 | 5 | 4 | 3 |
| Resistance Before Heating ($\Omega/\square$) | 104 | 130 | 107 | 55 | 100 | 121 | 126 | 140 |
| Resistance After Heating ($\Omega/\square$) | 136 | $2.7 \times 10^6$ | 247 | $>10^7$ | $>10^7$ | $>10^7$ | $1.2 \times 10^5$ | $1.9 \times 10^5$ |

Experimental data in Table 1 shows that: in case a baking temperature being greater than 190° C. while a baking time being greater than 30 minutes, the sheet resistance of the silver nanowire film is increased by more than 6 orders. In order to increase the sheet resistance of the silver nanowire film can by more than 6 orders, it can require the baking temperature of 200° C. with the baking time for approximately 5 minutes. The baking temperature and the baking time can be adjusted according to the line width and/or the particle size of the material used in the silver nanowire film, without being restricted by said experimental conditions.

FIGS. 8A-8B, FIGS. 8C-8D and FIGS. 8E-8F are images in scanning electron microscopy (SEM) in 5000 times and 20000 times of a silver nanowire film not being baked, images in SEM in 5000 times and 20000 times of the silver nanowire film being baked in 200° C. for an hour and images in SEM in 15000 times and 20000 times of the silver nanowire film being baked in 200° C. for five minutes, respectively.

Figure 8A:
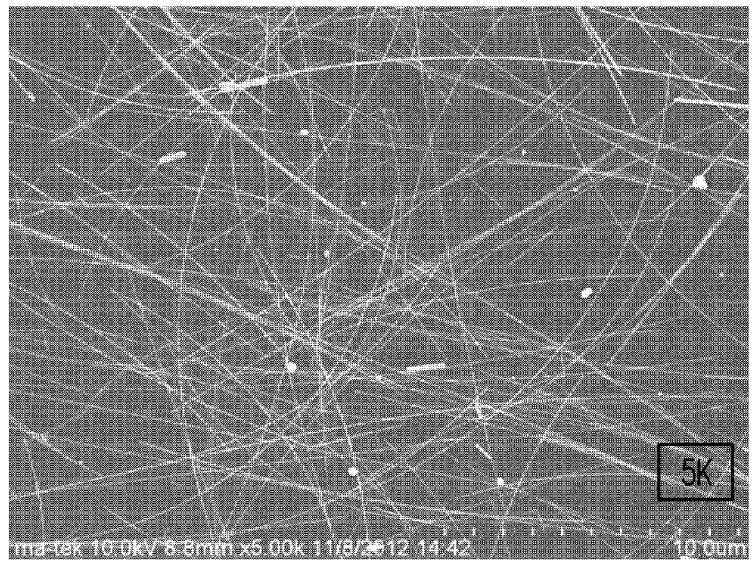
FIGS. 8A-8B, FIGS. 8C-8D and FIGS. 8E-8F are images in scanning electron microscopy (SEM) of a silver nanowire film not being baked, images in SEM of the silver nanowire film being baked in 200° C. for an hour and images in SEM of the silver nanowire film being baked in 200° C. for five minutes, respectively.
Figure 8B:
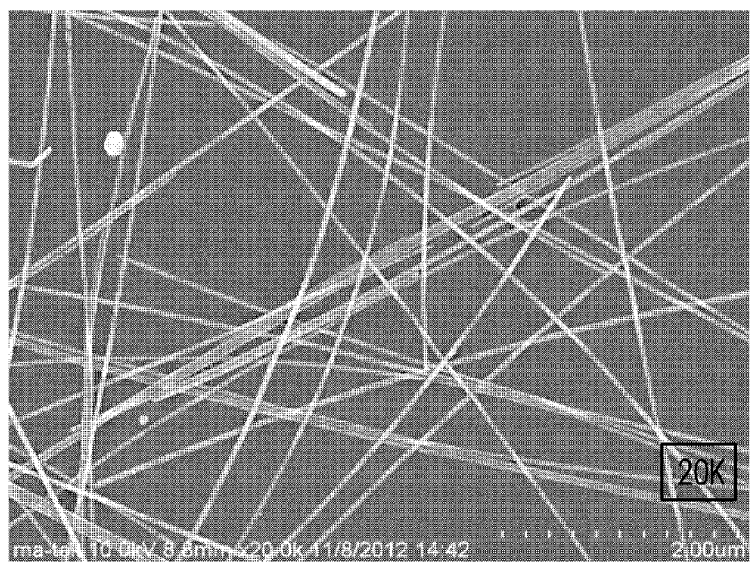
Figure 8C:
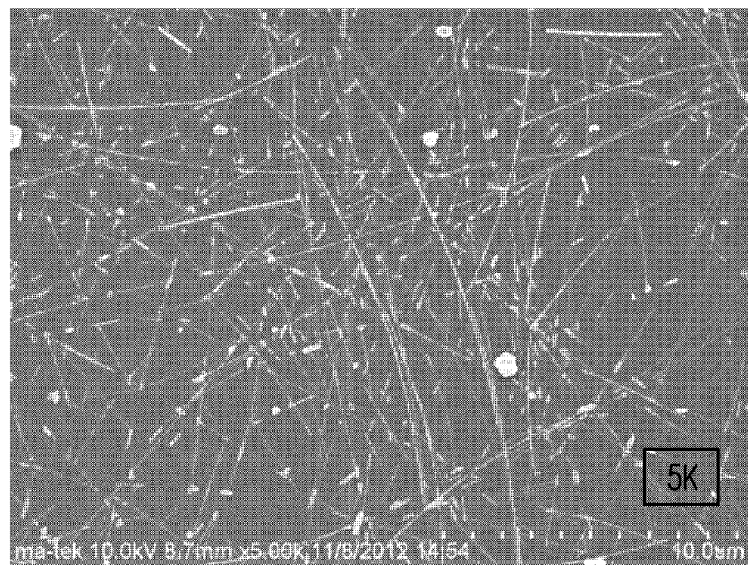
Figure 8D:
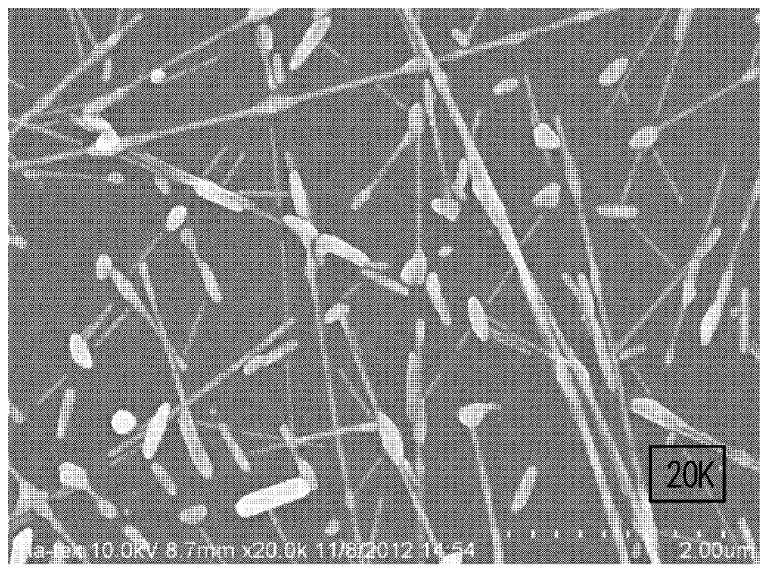
Figure 8E:
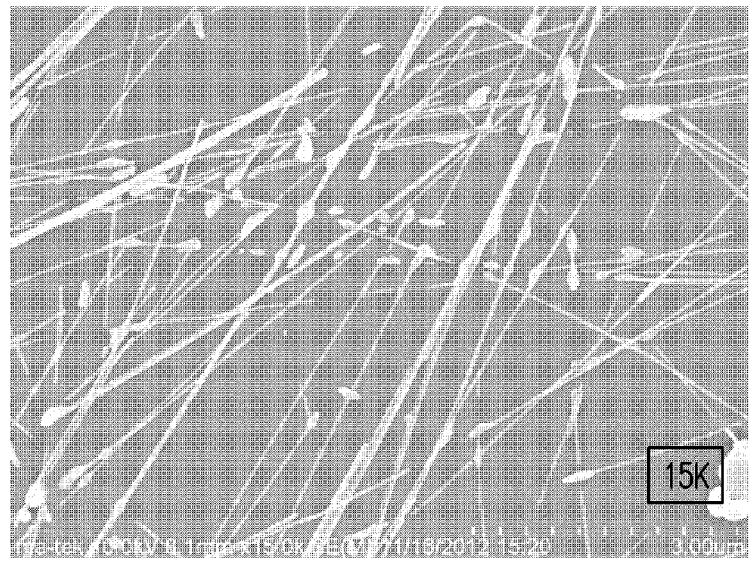
Figure 8F:
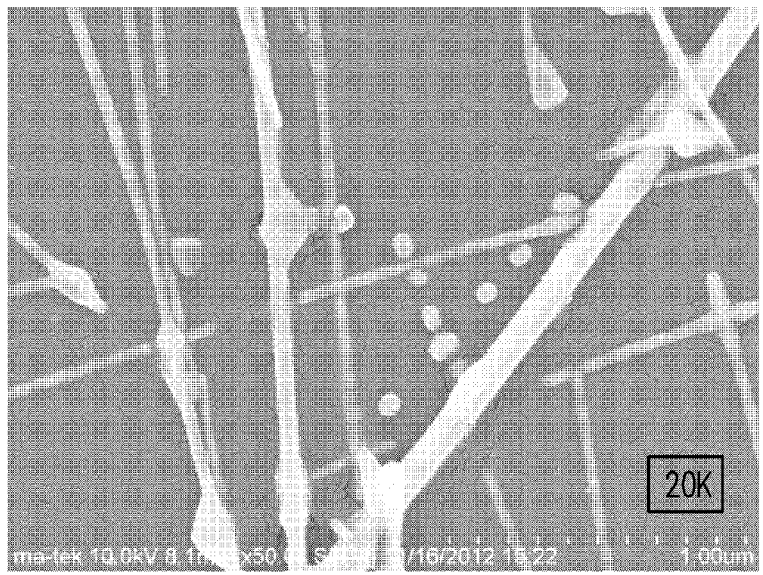

In view of FIGS. 8A-8B, the silver nanowire film not being baked is in form of separated integral lines, and the sheet resistance being measured is 25Ω/□. In view of FIGS. 8C-8D, the silver nanowire film being baked in 200° C. for an hour has the silver nanowire in form of broken wires, and the sheet resistance being measured is greater than $10^7$Ω/□. In view of FIGS. 8E-8F, the silver nanowire film being baked in 200° C. for 5 minutes has the silver nanowire converted into the nanosphere, which has the partially discontinuous phase in surface topography, and the sheet resistance being measured is greater than $10^7$Ω/□.

Figure 9:
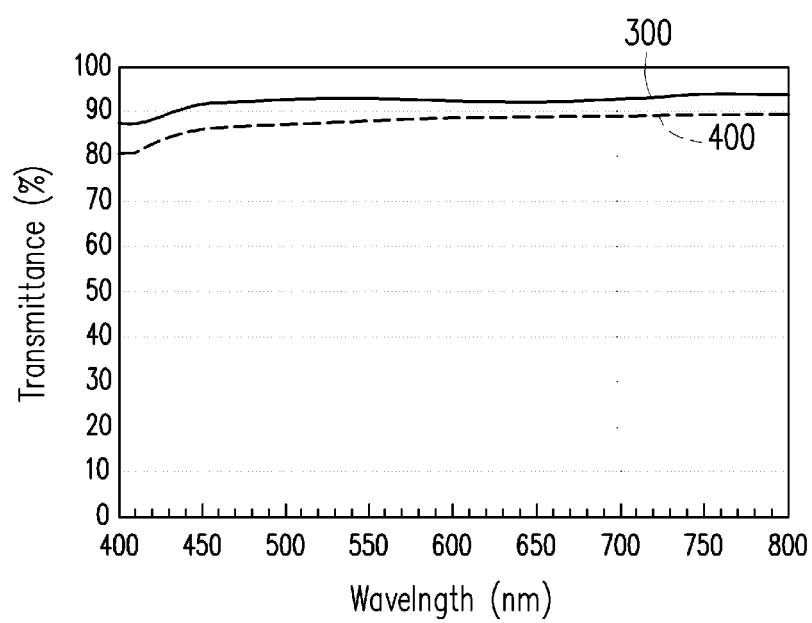
FIG. 9 illustrates transmittances of samples of the silver nanowire film not being baked and the silver nanowire film being baked.

Further, transmittance spectral measurements are performed respectively to a sample of silver nanowire film being dried by natural air instead of baking and a sample of silver nanowire film being baked in 200° C. for 5 minutes, a result thereof are respectively shown as curves 300 and 400 depicted in FIG. 9. In view of FIG. 9, at wavelength of 550 nm, a transmittance of the sample of silver nanowire film not being baked (the curve 300) is approximately 93%, whereas a transmittance of the sample of silver nanowire film being baked (the curve 400) is approximately 88%. A descending degree of the transmittance from the before baking to after baking is as small as approximately 5%.

Examples 9 to 15

A silver paste is screen-printed on a substrate and served as a measuring point, which is coated with the silver nanowire film on entire surface. By applying a regulating layer thereon for exposure and development, the patterned regulating layer is fabricated. Next, it is baked in 200° C. for 5 minutes. Resistance variations before and after baking are measured on each of electrodes with different line widths. Resistance variations before and after baking are measured on the electrodes with different line widths being measured is as shown in Table 2.

TABLE 2

|  | Example 9 | Example 10 | Example 11 | Example 12 | Example 13 | Example 14 | Example 15 | Average |
|---|---|---|---|---|---|---|---|---|
| Line Width (mm) | 4 | 0.2 | 3 | 0.4 | 2 | 0.8 | 1.6 | |
| Sheet Resistance Before Heating (Ω/□) | 38.0 | 37.1 | 38.1 | 37.4 | 40.3 | 39.7 | 40.5 | 38.73 |
| Sheet Resistance After Heating (Ω/□) | 40.7 | 40.9 | 41 | 40.4 | 42.5 | 41.4 | 42.2 | 41.3 |

In view of Table 2, after the silver nanowire film covered by the regulating layer is baked in 200° C., an average resistance after baking may be increased by 6.6%, which indicates that the conductive thereof is maintained. The silver nanowire film not being covered by the regulating layer has broken wires after being baked with high temperature, and the resistance thereof is increased by more than 6 orders. It can be difference between the two, thus the purpose of differentiate the conductivities for the silver nanowire film is accomplished.

Examples 16 to 17

Figure 10A:
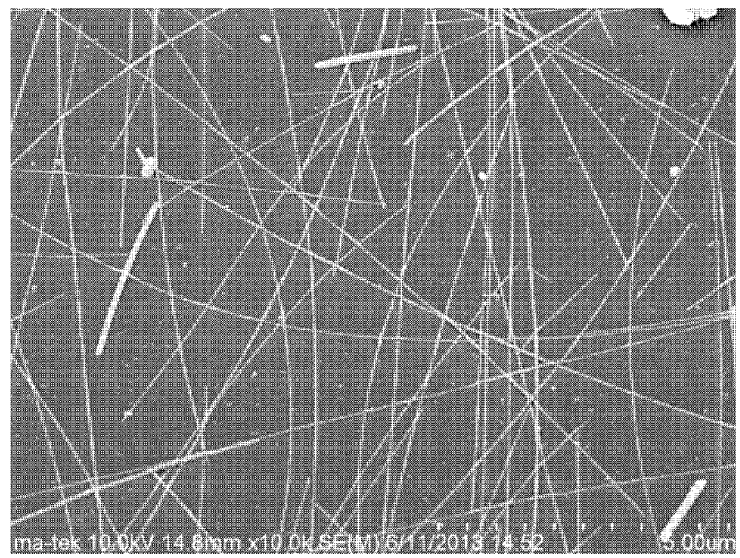
FIG. 10A and FIG. 10B are images in SEM of regions being covered by the insulation layer and regions not being covered by the regulating layer, respectively, after a plasma treatment of Example 16 is done.
Figure 10B:
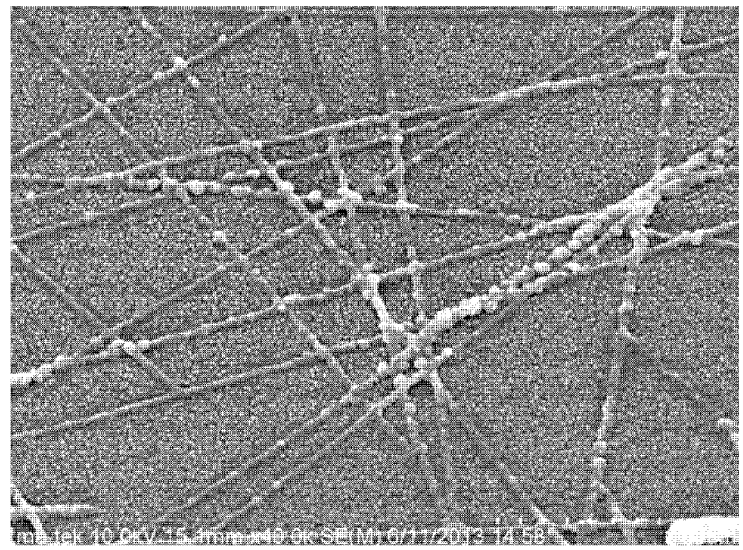
Figure 11A:
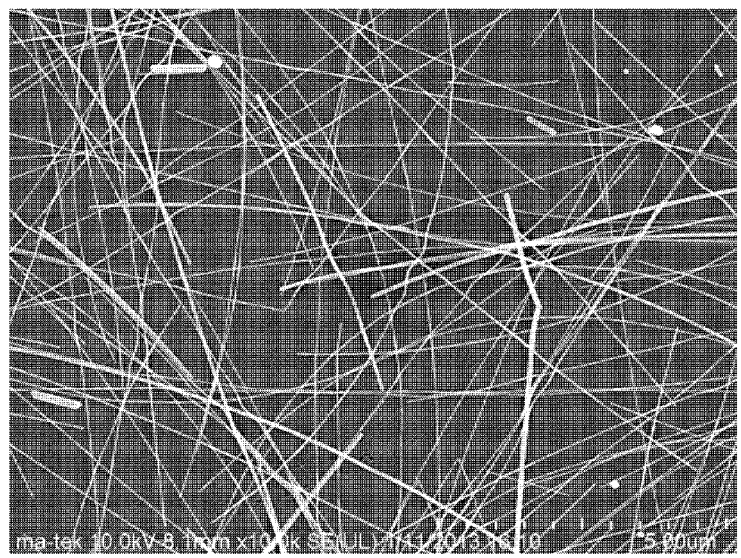
FIG. 11A and FIG. 11B are images in SEM of regions being covered by the insulation layer and regions not being covered by the regulating layer, respectively, after a plasma treatment of Example 17 is done.
Figure 11B:
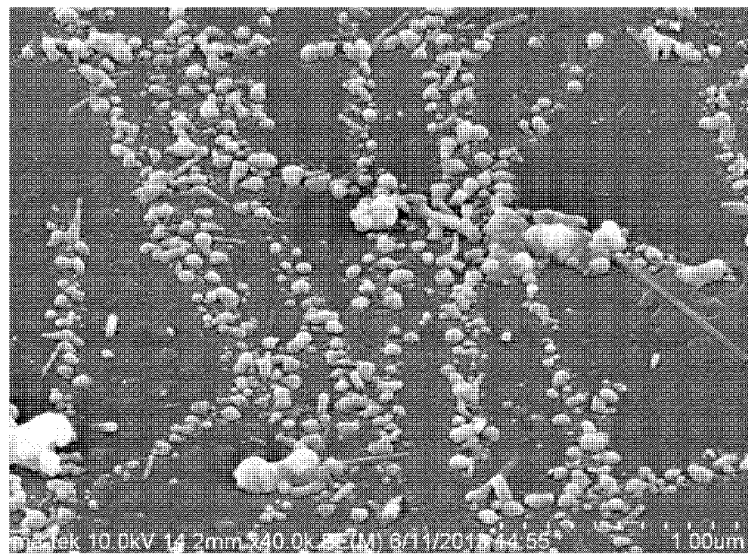

A substrate is coated with a silver nanowire film, and partial regions of the silver nanowire film are covered with the regulating layer, following by plasma processing in different atmospheres and different times. The sheet resistances of the regions covered by the regulating layer before and after plasma processing are compared, and a result thereof is as shown in Table 3. FIG. 10A and FIG. 10B are images in SEM of regions being covered by the regulating layer and regions not being covered by the regulating layer, respectively, after a plasma treatment of Example 16 is done. FIG. 11A and FIG. 11B are images in SEM of regions being covered by the regulating layer and regions not being covered by the regulating layer, respectively, after a plasma treatment of Example 17 is done.

TABLE 3

| Example | 16 | 17 |
|---|---|---|
| Plasma Gas Source | Oxygen | Carbon Tetrafluoride |
| Energy | 50 to 1000 W | 50 to 1000 W |
| Gas Flow Rate | 100 to 1000 sccm | 100 to 1000 sccm |
| Time (s) | 10 | 30 |
| Resistance (Ω/□) on the regions not being covered by the insulation layer before plasma processing | 105 | 110 |
| Resistance (Ω/□) on the regions not being covered by the insulation layer after plasma processing | >$10^7$ | >$10^7$ |

In view of Table 3, FIG. 10B and FIG. 11B after plasma processing, the silver nanowire film not being covered by the regulating layer generates broken wires, and an average resistance thereof after the plasma processing may be increased by almost 5 orders. The silver nanowire film covered by the regulating layer maintains the interconnected nano-structure network. It can be difference between the two, thus the purpose of differentiate the conductivities for the silver nanowire film is accomplished.

In an embodiment of the disclosure, the patterned regulating layer contacting the conductive interconnected nano-structure film together with specific conductivity regulating treatments are utilized, such that the conductive interconnected nano-structure film can provide characteristics in a regional high conductivity and a regional low conductivity, so as to accomplish the purpose of patterning the conductive interconnected nano-structure film. Also, since the interconnected nano-structure film being processed with energy is not etch-dissolved or removed. No visible etching marks are left after the conductive film is patterned, so that an optical quality thereof can be improved. The fabricating method of the patterned conductive film according to the embodiments of the disclosure can reduce uses of mask, so as to further reduce costs in fabrication. In addition, uses of chemical can be reduced to reduce environmental pollution.

Although the present disclosure has been described with reference to the above embodiments, it is apparent to one of the ordinary skill in the art that modifications to the described embodiments may be made without departing from the spirit of the present disclosure. Accordingly, the scope of the present disclosure will be defined by the attached claims not by the above detailed descriptions.

What is claimed is:

1. A patterned conductive film, comprising:
a conductive interconnected nano-structure film including a first region and a second region adjacent to the first region, wherein the first region has an interconnected nano-structure network and the second region has a partially discontinuous interconnected nano-structure, and a conductivity of the first region is at least 1000 times a conductivity of the second region; and
a patterned regulating layer disposed at one of the first region and the second region,
wherein the patterned regulating layer comprises an acrylic-based material, an epoxy-based material, a polyurethane-based material, a polyvinyl-alcohol-based material, a polyester-based material, a polyethylene-based material, or a hybrid material of more than two of the above, or an inorganic material including an aluminum oxide, a silicon oxide, a silicon nitride or a mixture thereof.

2. The patterned conductive film of claim 1, wherein the conductive interconnected nano-structure film comprises a nanowire, a nano-rod, a nanotube, a nano honey comb, a nanoparticle or a combination thereof.

3. The patterned conductive film of claim 1, wherein a material of the conductive interconnected nano-structure film comprises a metal material, a polymer material, a ceramic material, or a combination of more than two of said materials.

4. The patterned conductive film of claim 1, wherein a material of the conductive interconnected nano-structure film comprises a metal material including gold, silver, copper, iron, tin, nickel, aluminum, titanium, platinum, tungsten, zinc or cobalt, or a multicomponent alloy thereof.

5. The patterned conductive film of claim 1, wherein a material of the conductive interconnected nano-structure film comprises a polymer material including a polyacetylene conductive polymer material, a polythiophene conductive polymer material, a polypyrrole conductive polymer material, a polyaniline conductive polymer material or a poly (arylene vinylene) conductive polymer material.

6. The patterned conductive film of claim 1, wherein a material of the conductive interconnected nano-structure film comprises a ceramic material including a zinc oxide, an indium oxide, a tin oxide, a titanium nitride, an indium tin oxide, an aluminum zinc oxide, an indium zinc oxide, a gallium zinc oxide or an indium gallium zinc oxide, or a multicomponent metal oxide thereof, or a multicomponent metal nitride thereof.

7. The patterned conductive film of claim 1, wherein the patterned regulating layer comprises a material having thermal conductivity coefficient less than 1 W/m·K or a material having thermal insulation higher than that of glass, disposed at the first region; or a material having thermal conductivity coefficient greater than 1 W/m·K or a material having thermal insulation lower than that of glass, disposed at the second region.

8. The patterned conductive film of claim 1, wherein the patterned regulating layer comprises a material having light transmittance less than 50% and disposed at the first region, or a material capable of enhancing light transmittance of a wavelength of an infrared light and disposed at the second region.

9. The patterned conductive film of claim 1, further comprising:
a planar layer or a protective layer, covering the patterned regulating layer and the conductive interconnected nano-structure film; and
another conductive interconnected nano-structure film disposed on the planar layer or the protective layer, and the another conductive interconnected nano-structure film including a third region and a fourth region adjacent to the third region, wherein a conductivity of the third region is at least 1000 times a conductivity of the fourth region.

10. The patterned conductive film of claim 1, wherein the conductive interconnected nano-structure film is disposed between a first substrate and the patterned regulating layer.

11. The patterned conductive film of claim 1, wherein the patterned regulating layer is disposed between the conductive interconnected nano-structure film and a first substrate.

12. A method of fabricating a patterned conductive film, comprising:
providing a conductive interconnected nano-structure film including a first region and a second region adjacent to the first region;
disposing a patterned regulating layer at the first region or the second region of the conductive interconnected nano-structure film; and
providing an energy source to perform a conductivity regulating treatment to the conductive interconnected nano-structure film and the patterned regulating layer, the first region has an interconnected nano-structure network and the second region has a partially discontinuous interconnected nano-structure, wherein a conductivity of the conductive interconnected nano-structure film of the first region is at least 1000 times a conductivity of the conductive interconnected nano-structure film of the second region,
wherein the patterned regulating layer comprises an acrylic-based material, an epoxy-based material, a polyurethane-based material, a polyvinyl-alcohol-based material, a polyester-based material, a polyethylene-based material, or a hybrid material of more than two of the above, or an inorganic material including an aluminum oxide, a silicon oxide, a silicon nitride or a mixture thereof.

13. The method of fabricating the patterned conductive film of claim 12, further comprising:
covering the patterned regulating layer and the conductive interconnected nano-structure film with a planar layer after the conductivity regulating treatment is performed; and forming another conductive interconnected nano-structure film on the planar layer, and the another conductive interconnected nano-structure film including a third region and a fourth region adjacent to the third region, wherein a conductivity of the third region is at least 1000 times a conductivity of the fourth region.

14. The method of fabricating the patterned conductive film of claim 12, further comprising removing the patterned regulating layer.

15. The method of fabricating the patterned conductive film of claim 12, wherein the conductivity regulating treatment comprises a heat treatment process, an irradiation process or a plasma treatment process.

16. The method of fabricating the patterned conductive film of claim 15, wherein a temperature of the heat treatment process ranges from 150° C. to 400° C.

17. The method of fabricating the patterned conductive film of claim 15, wherein the irradiation process comprises providing a light source with a wavelength of 700 nm to 14 µm.

18. The method of fabricating the patterned conductive film of claim 12, wherein the conductive interconnected nano-structure film is located between a first substrate and the patterned regulating layer.

19. The method of fabricating the patterned conductive film of claim 18, further comprising:
forming an adhesion layer located on the patterned conductive film;
adhering a second substrate onto the adhesion layer; and
separating the first substrate.

20. The method of fabricating the patterned conductive film of claim 12, wherein the patterned regulating layer is located between the conductive interconnected nano-structure film and a first substrate.

21. A touch panel, comprising:
a substrate;
a first conductive interconnected nano-structure film including a first region and a second region adjacent to the first region, wherein the first region has an interconnected nano-structure network served as a first direction electrode pattern and the second region has a partially discontinuous interconnected nano-structure, and a conductivity of the first region is at least 1000 times a conductivity of the second region;
a second conductive interconnected nano-structure film including a third region and a fourth region adjacent to the third region, wherein third region has an interconnected nano-structure network served as a second direction electrode pattern and the fourth region has a partially discontinuous interconnected nano-structure, and a conductivity of the third region is at least 1000 times a conductivity of the fourth region; and
a planar layer located between the first conductive interconnected nano-structure film and the second conductive interconnected nano-structure film.

22. The touch panel of claim 21, wherein the first direction electrode pattern is a Y-axis electrode pattern, and the second direction electrode pattern is a X-axis electrode pattern.

23. The touch panel of claim 21, wherein the first conductive interconnected nano-structure film and the second conductive interconnected nano-structure film comprise a nanowire, a nano-rod, a nanotube, a nano honey comb, a nanoparticle or a combination thereof.

24. A touch panel, comprising:
a substrate;
a first direction bridge electrode pattern located on the substrate;
a patterned insulating layer covering the first direction bridge electrode pattern and exposing two ends of the first direction bridge electrode pattern; and
a conductive interconnected nano-structure film located on the substrate, and having a first region, a second region and a third region, wherein the first region and the third region are spaced apart from each other, and the second region is adjacent to the first region and the third region respectively, and wherein:
the first region has an interconnected nano-structure network insulated from the first direction bridge electrode pattern by using the patterned insulating layer, and served as a second direction electrode pattern;
the third region has an interconnected nano-structure network served as a first direction electrode pattern including a first portion and a second portion respectively located at two sides of the first region, and the first portion and the second portion are electrically connected to two ends of the first direction bridge electrode pattern not being covered by the patterned insulating layer, respectively; and
the second region has a partially discontinuous interconnected nano-structure, and conductivities of the first region and the third region are at least 1000 times a conductivity of the second region.

25. The touch panel of claim 24, wherein the first direction bridge electrode pattern being a X-axis bridge electrode pattern; the first direction electrode pattern being a X-axis electrode pattern; and the second direction electrode pattern being a Y-axis electrode pattern and a Y-axis bridge electrode pattern.

26. The touch panel of claim 24, wherein the conductive interconnected nano-structure film comprises a nanowire, a nano-rod, a nanotube, a nano honey comb, a nanoparticle or a combination thereof.

* * * * *